(12) United States Patent
Bedeschi et al.

(10) Patent No.: US 10,726,917 B1
(45) Date of Patent: Jul. 28, 2020

(54) TECHNIQUES FOR READ OPERATIONS

(71) Applicant: Micron Technology, Inc., Boise, ID (US)

(72) Inventors: Ferdinando Bedeschi, Biassono (IT); Riccardo Muzzetto, Arcore (IT); Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/254,962

(22) Filed: Jan. 23, 2019

(51) Int. Cl.
  *G11C 13/00* (2006.01)
  *G11C 16/04* (2006.01)
  *G11C 7/10* (2006.01)
  *G11C 16/28* (2006.01)

(52) U.S. Cl.
  CPC ......... *G11C 13/004* (2013.01); *G11C 7/1051* (2013.01); *G11C 16/0483* (2013.01); *G11C 16/28* (2013.01); *G11C 2013/0054* (2013.01)

(58) Field of Classification Search
  CPC . G11C 13/004; G11C 7/1051; G11C 16/0483; G11C 16/28
  See application file for complete search history.

(56) References Cited

U.S. PATENT DOCUMENTS

| 7,012,829 B2 * | 3/2006 | Kawashima | G11C 11/22 365/145 |
| 8,750,018 B2 * | 6/2014 | Youn | G11C 13/0007 365/148 |
| 9,070,424 B2 * | 6/2015 | Youn | G11C 11/1693 |
| 9,123,430 B2 * | 9/2015 | Cernea | G11C 7/062 |
| 2006/0221734 A1 * | 10/2006 | Bedeschi | G11C 7/062 365/201 |
| 2016/0343422 A1 * | 11/2016 | Marotta | G11C 7/062 |
| 2017/0053696 A1 * | 2/2017 | Jeong | G11C 7/18 |
| 2018/0090188 A1 * | 3/2018 | Chen | G11C 11/4094 |
| 2018/0294017 A1 * | 10/2018 | Chen | G11C 29/021 |
| 2020/0075076 A1 * | 3/2020 | Lee | G11C 11/4094 |

OTHER PUBLICATIONS

U.S. Appl. No. 16/121,224, by Lee et al., entitled "Source Follower-Based Sensing Scheme," filed Sep. 4, 2018 (69 pages).

* cited by examiner

*Primary Examiner* — Tri M Hoang
(74) *Attorney, Agent, or Firm* — Holland & Hart LLP

(57) ABSTRACT

Methods, systems, devices, and techniques for read operations are described. In some examples, a memory device may include a first transistor (e.g., memory node transistor) configured to receive a precharge voltage at a first gate and output first voltage based on a threshold of the first transistor to a reference node via a first switch. The device may include a second transistor (e.g., a reference node transistor) configured to receive a precharge voltage and output a second voltage based on a threshold of the second transistor to a memory node via a second switch. The first voltage may be modified by a reference voltage and input to the second transistor. The second voltage may be modified by a voltage stored on a memory cell and input to the first transistor. The first and second transistor may output third and fourth voltages to be sampled to a latch.

9 Claims, 11 Drawing Sheets

TECHNIQUES FOR READ OPERATIONS

BACKGROUND

The following relates generally to a system that includes at least one memory device and more specifically to techniques for read operations that may include offset cancellation.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, or reducing manufacturing costs, among other metrics. Some memory cells may be configured to store multiple states. Improving an efficiency (e.g., less power consumption, improved sensing accuracy) of a sensing component of memory devices may also be desired.

DETAILED DESCRIPTION

Figure 1:
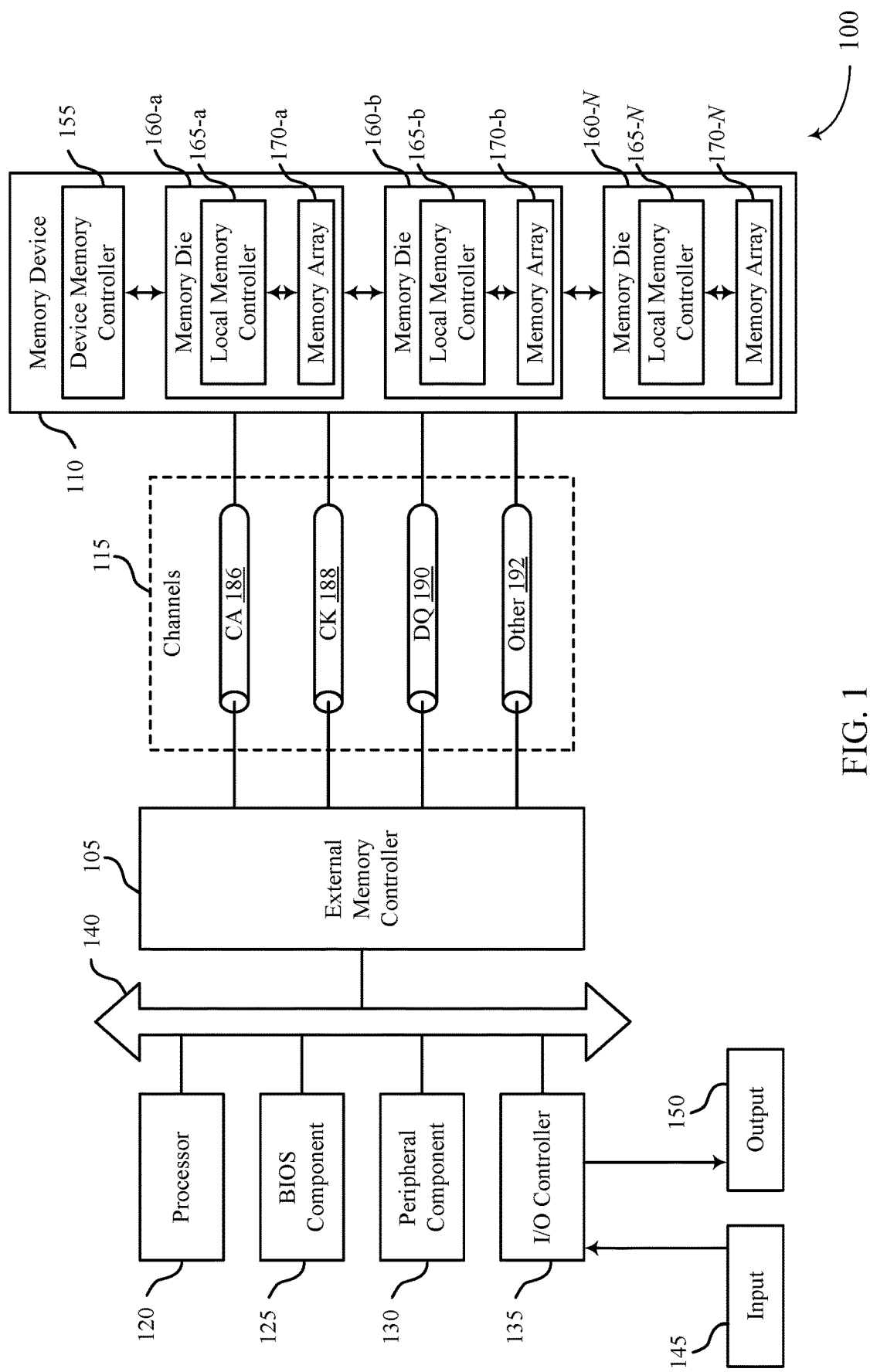
FIG. 1 illustrates an example of a system that supports techniques for read operations in accordance with examples as disclosed herein.

Memory devices use read operations to retrieve a data state (e.g., logic 1 or logic 0) stored on a memory cell by transferring a charge from the memory cell to a sense component. The data state stored on the memory cell may be determined by comparing a memory cell voltage to a reference voltage. The logic state stored on the memory cell may be compared to the reference voltage to determine the logic state stored on the memory cell. To improve sensing accuracy, a sense component may include circuitry to amplify the voltage response of the stored charge (e.g., as it is read from the memory cell). Additionally, the circuitry may amplify and/or adjust the level of the reference voltage to obtain an offset between the voltage level associated with the first memory state and the voltage level associated with the second memory state. For example, it may be desirable to have the reference voltage between (e.g., half way between) a first memory state voltage and the second memory state voltage.

In some cases, sense circuitry may include a transistor pair that has a reference transistor isolated from a signal (e.g., memory side) transistor. Each of the transistors may be configured as a source follower circuit where the output voltage may be proportional to the voltage applied to the gate. In some cases, the transistor pair may include a differential transistor pair. Further, each transistor may have a different threshold voltage that affects the voltage output of that transistor. Accordingly, the charge stored on the memory device may be affected by the memory side transistor threshold and the reference charge may be affected a different amount by the reference side transistor threshold. Thus, the final memory and reference voltages sampled by the sense component may vary based on a threshold mismatch between the different transistors, which may decrease the accuracy of a sense process (e.g., increasing bit error rate).

Techniques for sensing a memory cell voltage using a transistor pair with an offset cancellation component are described. The sense operation may be carried out in multiple phases where, during a first phase, each transistor in the transistor pair may compensate for the voltage threshold of the other transistor through charge sharing. For example, a precharge voltage subjected to a reference transistor threshold drop may be applied to the memory device side (e.g., memory node or signal node). Similarly, a precharge voltage subjected to the memory transistor threshold drop may be applied to the reference voltage side (e.g., reference node). Thus, at the end of the first phase the memory node may store a voltage that includes the threshold effect from the reference transistor and the reference node may store a voltage that includes a threshold effect from the signal transistor.

In a second phase, the reference node voltage may be shifted and amplified to achieve a reference voltage response at the sense component that aids determination of the stored memory state. For example, a reference node voltage may be offset from a memory voltage signal associated with a first logic state and second logic state. Likewise, the stored memory cell voltage can be applied to the memory node and the memory node voltage can be amplified to improve sensing accuracy.

In a third phase, the voltage on the reference node may be transferred to a sense component via the reference transistor and the voltage on the memory node may be transferred to the sense component via the memory transistor. Thus, the reference voltage may be offset by both the memory transistor threshold (e.g., from phase 1 precharge) and the reference transistor threshold (e.g., phase 3 sampling to sense component). Similarly, the memory voltage may be offset by both the reference transistor threshold (e.g., from phase 1 precharge) and the signal transistor threshold (e.g., phase 3 sampling to sense component). As a result, the voltage mismatch between the transistor pair may be effectively removed from the sampled reference and memory voltages. Removing variability due to mismatched transistor thresholds may improve sensing of the logic state stored by the memory cell.

Additionally or alternatively, memory device that include amplification circuitry to amplify and offset the reference voltage and amplify the memory voltage. In some cases amplification circuitry may include independent circuits for each of the memory side and reference side. That is, the memory device may have a first amplification circuit for the reference node and a second amplification circuit for the memory node. However, the circuitry (e.g., capacitors) associated with each of the amplification circuits may introduce one or more differences in voltage responses, for example, due to different leakage rates from electrical components (e.g., capacitors) in each of the circuits. Thus, variability between the reference voltage and memory voltage may result from such differences leading to increased variability between the reference voltages and memory voltages, which may reduce accuracy of a sense process.

Techniques for sensing a memory cell voltage using a coupled amplification circuit are described. In some cases, the memory amplification circuit and reference amplification circuit may be coupled (e.g., short circuited) to produce the same voltage response on each of the memory node and reference node. In some cases, an additional capacitive circuit is added to the reference node to mimic the voltage response of the memory node, for example due to capacitive effects of the digit line. The capacitive circuit may be initially coupled with a voltage source to charge the capacitive node during a precharge period (e.g., first phase). Before the amplification process the voltage source may be disconnected from the capacitive node. Then, in conjunction with the amplification procedure the capacitive node may be coupled to the reference node to tune the voltage response of the reference node to match the memory node, while having a consistent offset between the first memory state (e.g., voltage level associated with logic 1) and second memory state (e.g., voltage level associated with logic 0). As a result, variability due to independent amplification circuits may be decreased. In some cases, offset cancellation and coupled amplification may be implemented to improve the accuracy and/or reliability of a sense operation for a memory device.

Features of the disclosure are initially described in the context of a memory system and memory die as described with reference to FIGS. 1-3. Features of the disclosure are described in the context circuit diagrams, timing diagrams, and a diagram illustrating operation of a circuit as described with reference to FIGS. 4-8. These and other features of the disclosure are further illustrated by and described with reference to an apparatus diagram and flowcharts that relate to techniques for offset cancellation as described with references to FIGS. 9-11.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

In some examples, the memory device 110 or the memory die 160 may be coupled with or include one or more amplification components (e.g., to increase or decrease a voltage level), one or more signal differentiation components, one or more sense components or a combination thereof. Each memory cell of memory array 170, for example, may be coupled with a digit line that may be further coupled with a memory node. The memory node may be coupled to a first input node of a latch via a first transistor (e.g., source follower circuit). Each memory cell of memory array 170 may further be associated with a reference node. The reference node may be coupled to a second input node of the latch via a second transistor (e.g., a second source follower circuit). One or more amplification circuits may be coupled to the memory node or the reference node. For example, a first amplification circuit may be coupled to the memory node and a second amplification generation circuit may be coupled to the reference node. The first and second amplification circuits may increase, decrease or shift a voltage level at the memory or reference nodes to increase a memory voltage from a memory cell or a reference voltage at the first and second latch inputs.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, the external memory controller 105 or the local memory controller 165 may control voltage increases (e.g., a voltages boost) or voltage decreases (e.g., a voltage shift) associated with a sense operation for one or more memory cells in the memory arrays 170. For example, a first amplification circuit may be coupled with a memory node of a sense circuit and a second amplification circuit may be coupled with a reference node of the sense circuit. During a read operation, a controller may cause the first amplification circuit to increase (e.g., boost) a voltage on the memory node. The controller may also cause the second amplification circuit to decrease (e.g., shift) and increase (e.g., boost) a voltage on the reference node. Such boosting and shifting operation may be performed during a read operation to develop a reference voltage level that falls between a first logic state (e.g., logic 1) and a second logic state (e.g., logic 0). In some cases, the controller may cause one or more of the amplification circuits to modify a voltage increase or decrease of the memory or reference voltages during a read operation to improve sensing of the logic state stored in the memory cell. For example, a reference amplification circuit may apply a voltage decrease followed by a voltage increase to a reference voltage that results in the reference voltage level being approximately half way between the voltage signal level associated with a first logic state (e.g., logic 1) and a second logic state (e.g., logic 0) stored on a memory cell.

In some cases, one or more amplification circuits may be coupled between the memory and reference nodes to produce the same voltage response on each node. Further, the reference node may include a capacitive circuit that can be operated to tune the voltage response of the reference node to mimic the voltage response of the memory node. In some, cases the capacitive circuit may be coupled to a voltage source and ground element. In some cases the capacitive circuit may be coupled the reference node via a switch such that the capacitive circuit may be initially decoupled from the reference node. The capacitive element may be coupled to the reference node during a read operation to modify the voltage level of the reference node before or in coordination with sampling the reference voltage to a sense component.

Figure 2:
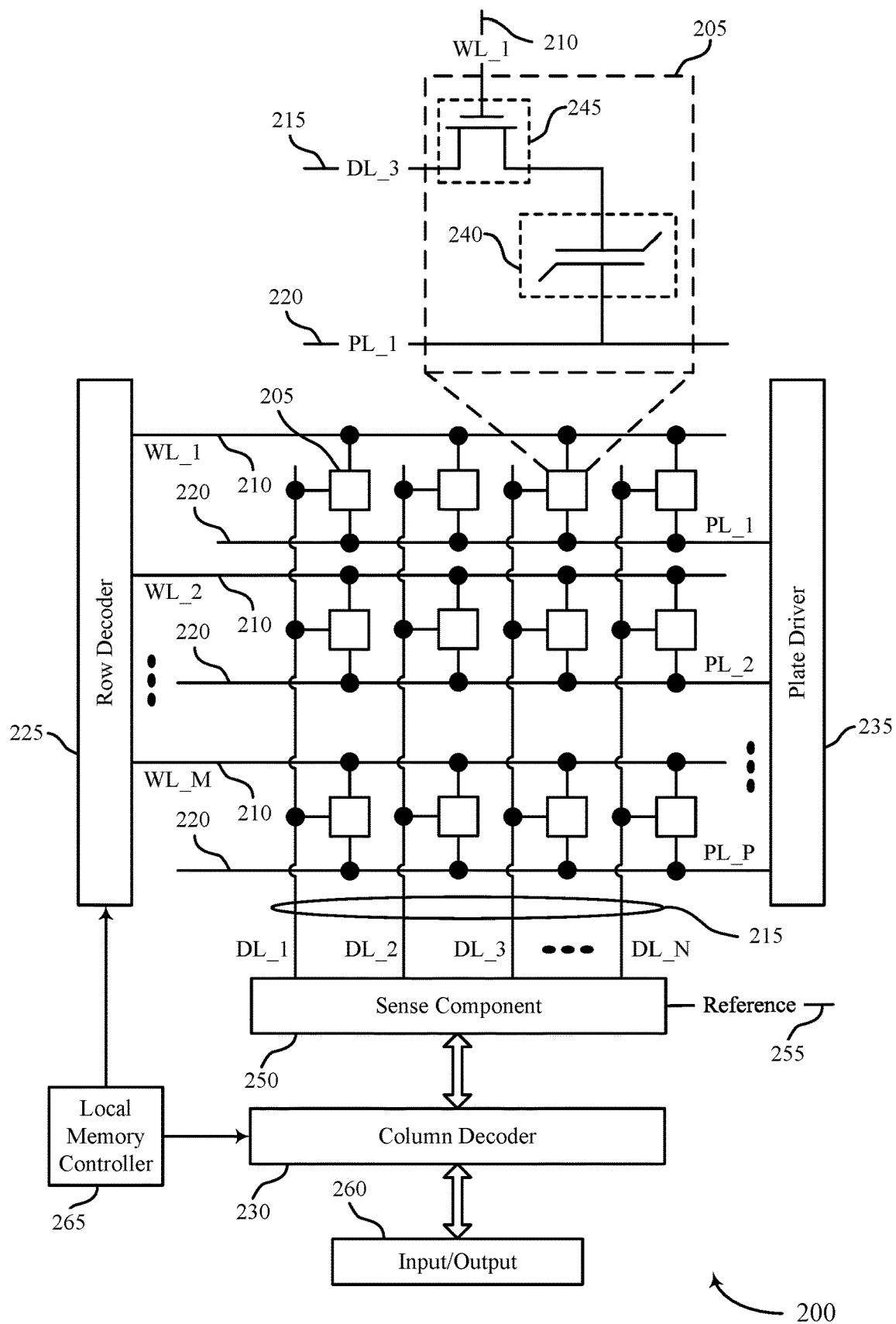
FIG. 2 illustrates an example of a memory die that supports techniques for read operations in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to detect a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of memory cell 205 may be output through column decoder 230 as output 260. In some cases, the sense component 250 may be part of another component (e.g., a column decoder 230, row decoder 225). In some cases, the sense component 250 may be in electronic communication with the row decoder 225, the column decoder 230, and/or the plate driver 235.

In some examples, the sense component 250 may include, or may be coupled with, a differential circuit coupled to one or more memory cells 205 and reference signal 255 input. The differential circuit may include a memory node coupled to one or more digit lines 215 and a reference node coupled to the reference signal input. The memory node may be coupled to a first transistor (e.g., first source follower circuit) and a first amplification circuit. The reference node may be coupled to a second transistor (e.g., second source follower circuit) and a second amplification circuit. In some cases, the first source follower may couple the signal node to a first input of a latch and the second source follower may couple the reference node to a second input of the latch. A voltage signal read from a memory cell 205 to the memory node may be modified (e.g., increases or decreased) by the first amplification circuit before being applied to the first input of the latch. In some cases, a reference voltage of the reference voltage signal 255 may be modified by a second amplification circuit before being applied to the second input of the latch. The voltage signal and reference voltage may be applied to the latch via activating the first and second source follower circuits. In general, the latch may compare a voltage level of the signal with the reference voltage and output a signal based on a logic state stored at a memory cell 205.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205.

The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3A:
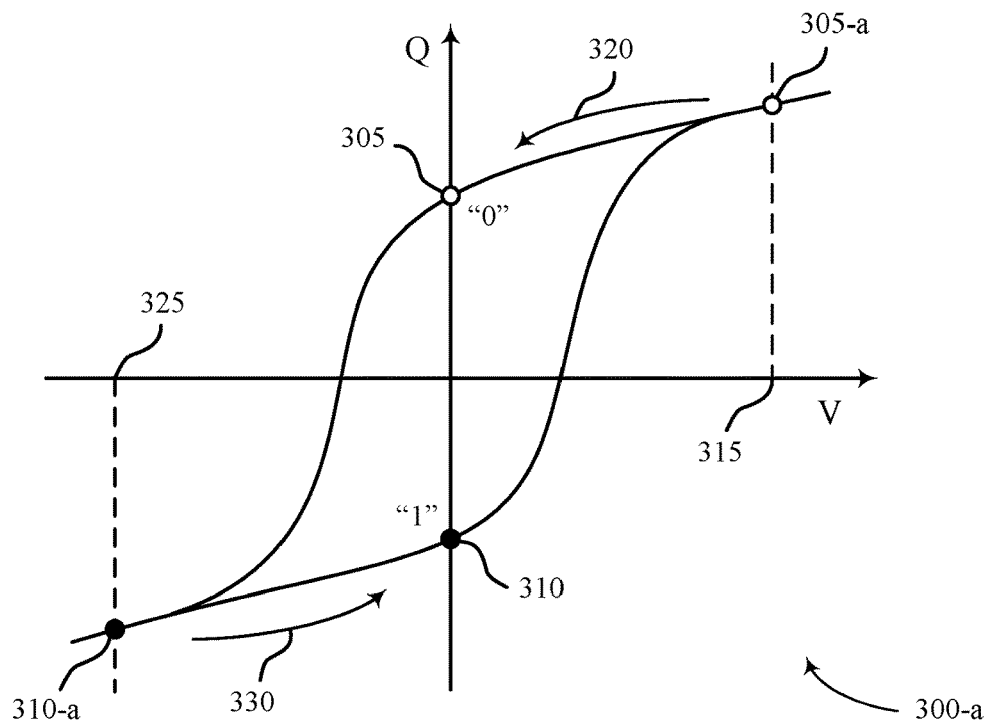
FIGS. 3A and 3B illustrate examples of hysteresis curves that support techniques for read operations in accordance with examples as disclosed herein.
Figure 3B:
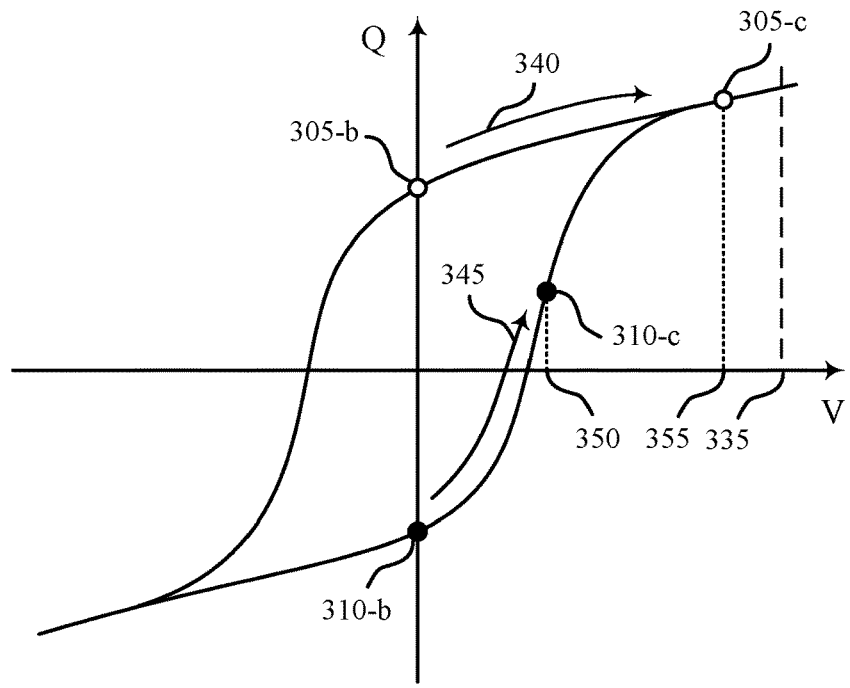

FIGS. 3A and 3B illustrate examples of non-linear electrical properties of a ferroelectric memory cell with hysteresis curves 300-$a$ and 300-$b$ in accordance with various examples as disclosed herein. Hysteresis curves 300-$a$ and 300-$b$ illustrate an example ferroelectric memory cell writing and reading process, respectively. Hysteresis curves 300-$a$ and 300-$b$ depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-$a$ and 300-$b$ may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-$a$ and 300-$b$ represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-$a$ and 300-$b$.

As depicted in hysteresis curve 300-$a$, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-$a$ is reached. Upon removing voltage 315, charge state 305-$a$ follows path 320 until it reaches charge state 305 at zero voltage. Similarly, charge state 310 is written by applying a net negative voltage 325, which results in charge state 310-$a$. After removing negative voltage 325, charge state 310-$a$ follows path 330 until it reaches charge state 310 at zero voltage. Charge states 305-$a$ and 310-$a$ may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-$b$ or 310-$b$ was initially stored. For example, hysteresis curve 300-$b$ illustrates two possible stored charge states 305-$b$ and 310-$b$. Voltage 335 may be applied across the capacitor 240 as discussed with reference to FIG. 2. In other cases, a fixed voltage may be applied to the cell plate and, although depicted as a positive voltage, voltage 335 may be negative. In response to voltage 335, charge state 305-$b$ may follow path 340. Likewise, if charge state 310-$b$ was initially stored, then it follows path 345. The final position of charge state 305-$c$ and charge state 310-$c$ depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-$c$ and 310-$c$ on hysteresis curve 300-$b$ may thus depend on the capacitance of the digit line and may be determined through a load-line analysis—i.e., charge states 305-$c$ and 310-$c$ may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the different between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In some cases, a ferroelectric memory cell may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction. In some cases, a ferroelectric memory cell may lose its initial logic state after a read operation. For example, if charge state 310-b is stored, the charge state may follow path 345 to charge state 305-c during a read operation and, after removing voltage 335, the charge state may relax to the charge state 305-b by following path 340.

Hysteresis curve 300-b illustrates an example of reading a memory cell that is configured to store the charge state 305-b and the charge state 310-b. A read voltage 335 may be applied, for example, as a voltage difference via a digit line 215 and a plate line 220 as described with reference to FIG. 2. Hysteresis curve 300-b may illustrate read operations where the read voltage 335 is negative voltage difference Vcap (e.g., where Vbottom−Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335 is shown as a negative voltage across the ferroelectric capacitor 240, in alternative operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-a (e.g., a logic 1) or at charge state 310-a (e.g., a logic 0).

Figure 4:
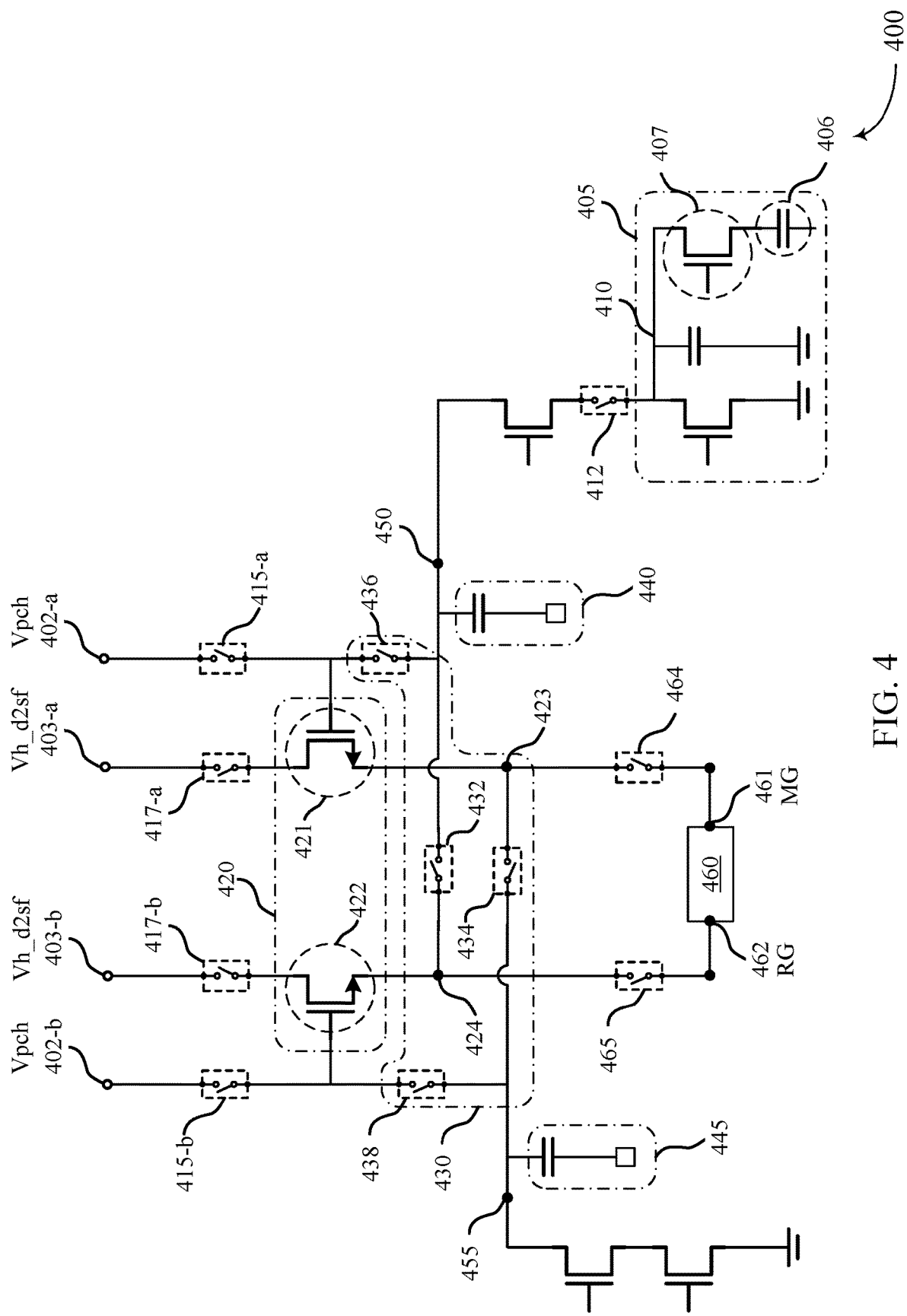
FIG. 4 illustrates an example of a circuit that supports techniques for read operations in accordance with examples as disclosed herein.

FIG. 4 illustrates an example of a circuit 400 that supports techniques for read operations in accordance with examples as disclosed herein. The circuit 400 illustrates how a transistor pair 420 may be coupled with an offset cancellation component 430, signal shift component 440, a reference shift component 445, a latch 460 and circuitry that may accompany such a configuration. The circuit 400 may include one or more components described herein with reference to FIGS. 1, 2 and 3. For example, the circuit 400 may include a memory cell 405, which may be an example memory cell 205 described with reference to FIG. 2; a digit line 410, which may be an example of digit line 215 as described with reference to FIG. 2; a transistor pair 420, a offset cancellation component 430; a signal shift component 440 associated with a signal node 450 (e.g., memory node); a reference shift component 445 associated with a reference node 455; and a latch 460. In some examples, the transistor pair 420 may be referred to as a signal transistor 421 and a reference transistor 422. The circuit 400 may also include precharge voltage source 402, and an input voltage source 403.

The transistor pair 420 may include a signal transistor 421 and a reference transistor 422. In some cases, the signal transistor 421 and reference transistor 422 may each be a source follower circuit. In this regard, charge/voltage transferred to the output node (represented by arrows) of each of signal transistor 421 and reference transistor 422 may be proportional to the voltage applied to the gate of the transistor. Further, in some cases, signal transistor 421 may have a first threshold drop between the gate and the output node and reference transistor 422 may have a second threshold drop, that is different than the first threshold drop, between the gate and the output node. Thus, different voltage drops may occur for charged transferred by each of the signal transistor 421 and reference transistor 422. Accordingly, circuit 400 may include an offset cancellation component 430, which may be configured to cancel out the mismatched threshold voltage drops for different transistor pair 420. As a result, a signal voltage applied to a first latch input 461 and reference voltage applied to a second latch input 462 may have decreased variability due to differences in the thresholds of the signal transistor 421 and reference transistor 422.

The transistor pair 420 may be configured to couple a signal node 450 to a first latch input 461 and a reference node 455 to a second latch input 462. Further, circuit 400 may include a signal shift component 440 (e.g., amplification circuit) coupled to signal node and reference shift component 445 (e.g., amplification circuit) coupled to reference node. Accordingly, a voltage stored at memory cell 405 may be modified (e.g., amplified, shifted, offset, etc.) by one or more components of circuit 400 before being input to first latch input 461. Similarly, a reference voltage may be modified (e.g., amplified, shifted, offset, etc.) by one or more components of circuit 400 before being input to second latch input 462. In this regard, circuit 400 may be configured to develop a signal voltage associated with a logic state (e.g., logic 0 or logic 1) and a reference voltage at latch 460 inputs that provides an improved sense voltage offset between a signal voltage representing a logic state and the reference voltage.

The circuit 400 may further include multiple switches (e.g., 415, 417, 432, 434, 436, 438, 464, and 465) configured to couple and decouple different portions/nodes of circuit 400 during operation of circuit 400 (e.g., during a read operation). The switches selectively couple different nodes together at different times to allow each transistor of the transistor pair 420 to compensate for the other transistor's threshold voltage. That is, in some cases, operation of circuit 400, may include opening different switches at different times during a read operation in order to couple and decouple different portions of circuit 400. In some cases, circuit 400 may include switches that couple and decouple the circuit 400 from one or more voltage sources. For example circuit 400 may include precharge switches 415, which couple precharge voltage source 402 to transistor pair 420 and input switches 417, which couple input voltage source 403 to transistor pair 420. The circuit 400 may also include switch that couple and decouple signal node 450 to reference node 455, which may be referred to as a cross-coupling operation. For example, offset cancellation component 430 may also include a first offset switch 432, a second offset switch 434, a third offset switch 436 and a fourth offset switch 438. Different switches may be operated to couple reference output node 424 to signal node 450 or signal output node 423 to reference node 455. In some cases, circuit 400 may also include one or more switches to couple and decouple a latch 460 from the transistor pair 420. For example, first latch switch 464 may couple and decouple signal output node 423 to first latch input 461 and second latch switch 465 may couple and decouple reference output node 424 to second latch input 462. A digit line switch 412 may also couple digit line 410 to signal node 450. Each switch may be one or more transistors, diodes, rectifiers, triacs, or the like, or a combination thereof. In some example one or more switches may be operated by one or more controllers. Additionally or alternatively, one or more switches may operate in an analog mode, for example, where electrical signals from one or more parts of circuit 400 or signals from other parts of memory device active/deactivate the switches (e.g., transistor being active by having voltage applied to gate).

The transistor pair 420 may facilitate inputting a signal voltage and reference voltage to latch 460 to determine a logic state stored in memory cell 405 during a read operation. For example, signal transistor 421 may have an input coupled to input voltage source 403, an output coupled to signal output node 423 and a gate coupled to precharge voltage source 402 or signal node 450. A signal charge (e.g., charge associated with a logic state stored on memory cell 405) may be transferred between digit line 410 and the gate of signal transistor 421 during a read operation. Further, the signal charge may be transferred from the gate of signal transistor 421 (e.g., charge from precharge voltage source 402 or signal node 450) to signal output node 423 based on the operation of input switch 417-a to couple and decouple input voltage source 403 to the input of signal transistor 421. Similarly, a reference charge (e.g., charge associated with a reference voltage source) may be transferred between reference node 455 and the gate of reference transistor 422. Further, reference transistor 422 may have an input coupled to input voltage source 403, an output coupled to reference output node 424 and a gate coupled to precharge voltage source 402 or reference node 455. A reference charge may be transferred from the gate of reference transistor 422 (e.g., charge from precharge voltage source 402 or reference node 455) to reference output node 424 based on operation of input switch 417-b to couple and decouple input voltage source 403 to the input of reference transistor 422.

The operation of transferring a signal charge from the gate of signal transistor 421 to signal output node 423 may modify (e.g., decrease) the signal charge by a first threshold effect of signal transistor 421. Similarly, the operation of transferring a reference charge from the gate of reference transistor 422 to reference output node 424 may modify (e.g., decrease) the reference charge by a second threshold effect of reference transistor 422. Thus, a signal charge transferred to signal output node 423 may be independently effected by the signal transistor 421 threshold and a reference charge transferred to reference output node 424 may be independently effected by reference transistor 422 threshold, thus creating a threshold mismatch between a signal charge and a reference charge.

In some cases, a read operation may include a precharge phase (e.g., first phase) as part of an offset process to compensate for threshold mismatch between transistor pair 420. For example, at the first phase, the circuit 400 may be configured such that offset cancellation component 430 may couple (e.g., cross-couple) reference output node 424 to signal node 450 and signal output node 423 to reference node 455 to compensate for a threshold mismatch between signal transistor 421 and reference transistor 422. In some cases, a first offset switch 432 may be coupled with reference output node 424 and signal node 450 and configured to selectively couple and decouple reference output node 424 to signal node 450. A second offset switch 434 may be coupled with signal output node 423 and reference node 455 and configured to selectively couple and decouple signal output node 423 to reference node 455. Further, in some cases, first precharge switch 415-a may couple precharge voltage source 402 to the gate of signal transistor 421 and second precharge switch 415-b may couple precharge voltage source 402 to the gate of reference transistor 422. Additionally or alternatively, during the first phase, third offset switch 436 may be deactivated to decouple signal node 450 from the gate of signal transistor 421, fourth offset switch 438 may be deactivated to decouple reference node 455 from the gate of reference transistor 422, first latch switch 464 may be deactivated to decouple signal output node from first latch input 461 and second latch switch 465 may be deactivated to decouple reference output node from second latch input 462.

Accordingly, during a read operation, each of the signal node 450 and reference node 455 may be precharged by cross-coupling reference node 455 to the precharge voltage source 402-a coupled to the gate of signal transistor 421 and signal node 450 to the precharge voltage source 402-b coupled to the gate of reference transistor 422.

Additionally or alternatively, a digit line switch 412 may be coupled with the digit line 410 and the signal node 450 and configured to selectively couple and decouple digit line 410 to signal node 450. During a read operation a charge associated with voltage signal stored on memory cell 405 representing a logic state (e.g., logic 1 or logic 0) may be read/transferred to digit line 410. Further, during the read operation, digit line 410 may be coupled to signal node 450 thereby transferring the signal charge (e.g., associated with a logic state) between digital line and signal node 450.

Circuit 400 may be operated (e.g., by a controller) to couple first precharge voltage source 402-a to the gate of signal transistor 421 by activating first precharge switch 415-a, couple input voltage source 403-a to the input of signal transistor 421 by activating first input switch 417-a, and couple signal output node 423 to reference node 455 by activating first offset switch 432. In this regard, a signal precharge that is modified by the signal transistor 421 threshold may be transferred to reference node 455. Additionally or alternatively, circuit 400 may be further operated to couple second precharge voltage source 402-b to the gate of reference transistor 422 by activating second precharge switch 415-b, couple input voltage source 403-b to the input of reference transistor 422 by activating second input switch 417-b, and couple reference output node 424 to signal node 450 by activating second offset switch 434. In this regard, a reference precharge that is modified by the reference transistor 422 threshold may be transferred to signal node 450. In some cases, circuit 400 may be operated to activate digit line switch 412 to transfer a signal charge associated with a logic state stored at memory cell 405 between the digit line 410 and signal node 450. In some cases, a reference precharge transferred from reference output node 424 may modify (increase or decrease) a signal charge (e.g., associated with a logic state) transferred to signal node 450 from digit line 410.

In some cases, after the reference precharge has been transferred between reference output node 424 and signal node 450, first offset switch 432 may be deactivated thereby decoupling reference output node 424 from signal node 450. Similarly, after signal precharge has been transferred between signal output node 423 and reference node 455, second offset switch 434 may be deactivated thereby decoupling signal output node 423 from reference node 455. Additionally or alternatively, one or more of precharge switches 415 or input switches 417 may also be deactivated thereby decoupling the precharge voltage source 402 from the gates of the transistor pair 420 and input voltage source 403 from the inputs of transistor pair 420.

Circuit 400 may be configured to perform a second phase of a read operation that includes developing (e.g., modifying) the signal voltage and reference voltage before transferring a signal charge and reference charge to latch 460. Accordingly, the circuit 400 may include a third offset switch 436 coupled with signal node 450 and the gate of signal transistor 421 and configured to selectively couple signal node 450 with the gate of signal transistor 421. A fourth offset switch 438 may be coupled with reference node 455 and the gate of reference transistor 422 and configured to selectively couple reference node 455 with the gate of reference transistor 422. In some cases, during the second phase, precharge switches 415 and input switches 417 may be deactivated thereby decoupling precharge voltage source 402 and input voltage source 403. In some cases, first offset switch 432 and second offset switch 434 may be deactivated thereby decoupling signal node from reference output node 424 and reference node 455 from signal output node 423. In some cases, first latch switch 464 and second latch switch 465 may remain deactivated.

Additionally or alternatively, a signal shift component 440 may be coupled to signal node 450 and a reference shift component 445 may be coupled to reference node 455. Signal shift component 440 may be operable to transfer a charge to signal node (e.g., boost the voltage of signal node) thereby modifying (e.g., increasing) a charge at signal node 450. Reference shift component 445 may be operable to transfer charge to or from (e.g., shift or boost the voltage of signal node) thereby modifying (e.g., decreasing or increasing) a charge at reference node 455. For example, at a first time of the second phase, reference shift component 445 may be operable to shift the charge at reference node 455 to decrease a voltage level on reference node 455. Such operation may be performed to develop a reference voltage offset between the reference voltage and the signal voltage to is input to latch 460. At a second time, signal shift component 440 may be operable to boost the signal charge at signal node 450 to increase a voltage level on the signal node 450 and reference shift component 445 may be operable to boost the reference charge at reference node 455 to increase a voltage level on reference node 455. Such operation may be performed to develop the signal voltage and reference voltage response before being input to latch 460.

Circuit 400 may be operated (e.g., by a controller) to couple signal node 450 to the gate of signal transistor 421 by activating third offset switch 436 and couple reference node 455 to the gate of reference transistor 422 by activating fourth offset switch 438. As a result, a signal charge (e.g., precharge voltage offset by the reference transistor threshold from phase 1) at signal node 450 may be transferred to the gate of signal transistor 421 thereby biasing the gate of the signal transistor 421 to a signal voltage level. A reference charge (e.g., precharge voltage offset by the signal transistor threshold from phase 1) at reference node 455 may also be transferred to the gate of reference transistor 422 thereby biasing the gate of reference transistor 422 to a reference voltage level. Additionally or alternatively, at a first time, reference shift component 445 may be operated to transfer a charge from reference node 455 to decrease a reference voltage level at reference node 455, thereby decreasing the reference voltage biasing the gate of reference transistor 422 via the activated fourth offset switch 438. At a second time, signal shift component 440 may be operated to transfer a charge to the signal node 450 thereby increasing a signal voltage level biasing the gate of signal transistor 421 and reference shift component 445 may be operated to transfer a charge to the reference node 455 thereby increasing the reference voltage level biasing the gate of reference transistor 422.

In some cases, at a third time, word line transistor 407 may be activated thereby transferring a charge stored on memory cell 405 to the gate of signal transistor 421 via activated digit line switch 412 and third offset switch 436. In some examples the third time occurs after the shift operations performed during the second time. As a result, the signal voltage level biasing the gate of signal transistor 421 may by modified (e.g., increased or decreased) based on the charge stored on memory cell 405. The charge stored on memory cell 405 may be based on a logic state (e.g., logic 1 or logic 0) stored on memory cell 405 and thus, a charge stored to indicate a first memory state (e.g., logic 1) may modify the signal voltage level differently than a charge stored indicate a second memory state (e.g., logic 0).

In some cases, circuit 400 may be configured to perform a third phase of the read operation that includes compensating for the threshold mismatch of transistor pair 420 before sampling the signal voltage and reference voltage to latch 460. For example, circuit 400 may include first latch switch 464 coupled with signal output node 423 and first latch input 461 and configured to selectively couple and decouple signal output node 423 to first latch input 461. Circuit 400 may also include a second latch switch 465 coupled with reference output node 424 and second latch input 462 and configured to selectively couple and decouple reference output node 424 to second latch input 462. During the third phase, circuit may be configured such that input switches 417, third offset switch 436, fourth offset switch 438, first latch switch 464, and second latch switch 465 are activated thereby coupling the signal node 450 with first latch input 461 and reference node 455 with second latch input 462. Additionally or alternatively, precharge switches 415, first offset switch 432, second offset switch 434, and digit line switch may be deactivated thereby decoupling precharge voltage source 402 from circuit 400 and memory cell 405 from signal node 450. Further, in some cases, first offset switch 432 and second offset switch 434 may remain deactivated such that signal node 450 remains decoupled from reference output node 424 and reference node 455 remains decoupled from signal output node 423.

Circuit 400 may be operated to couple input voltage source 403-*a* with the input of signal transistor 421 via activating first input switch 417-*a*. Signal transistor 421 may become active and transfer a signal output charge to signal output node 423. The signal output charge may be based on the signal charge at the gate of signal transistor 421. For example, the signal output charge may be proportional to the signal charge at the gate of signal transistor 421 and be modified (e.g., decreased) by the threshold drop associated with signal transistor 421. In this regard, signal output charge may be based on both the threshold from reference transistor 422 as a result of the precharge configuration (e.g., first phase) of circuit 400 and the threshold from signal transistor 421 as a result of the third phase configuration of circuit 400.

Circuit 400 may further be operated to couple input voltage source 403-*b* with the input of reference transistor 422 via activating second input switch 417-*b*. Reference transistor 422 may become active and transfer a reference output charge to reference output node 424. The reference output charge may be based on the reference charge at the gate of the reference transistor 422. For example, the reference output charge may be proportional to the reference charge at the gate of reference transistor 422 and be modified (e.g., decreased) by the threshold drop associated with reference transistor 422. In this regard, reference output charge may be based on both the threshold from signal transistor 421 as a result of the precharge configuration (e.g., first phase) of circuit 400 and the threshold from reference transistor as a result of the third phase configuration. Accordingly, each of the signal output charge and reference output charge are based on both the signal transistor 421 threshold and reference transistor 422 threshold, which may effectively result in compensating for the threshold mismatch between the transistor pair 420.

In some cases, in the third phase, circuit 400 may be operated to activate first latch switch 464 thereby coupling signal output node 423 to first latch input 461 resulting in the signal output charge being sampled to latch 460. Similarly, second latch switch 465 may be activated thereby coupling reference output node 424 to second latch input 462 resulting in the reference output charge being sample to latch 460. Accordingly, a voltage difference between the reference voltage level and the signal voltage level may be used to determine a logic state stored on memory cell 405.

Figure 5:
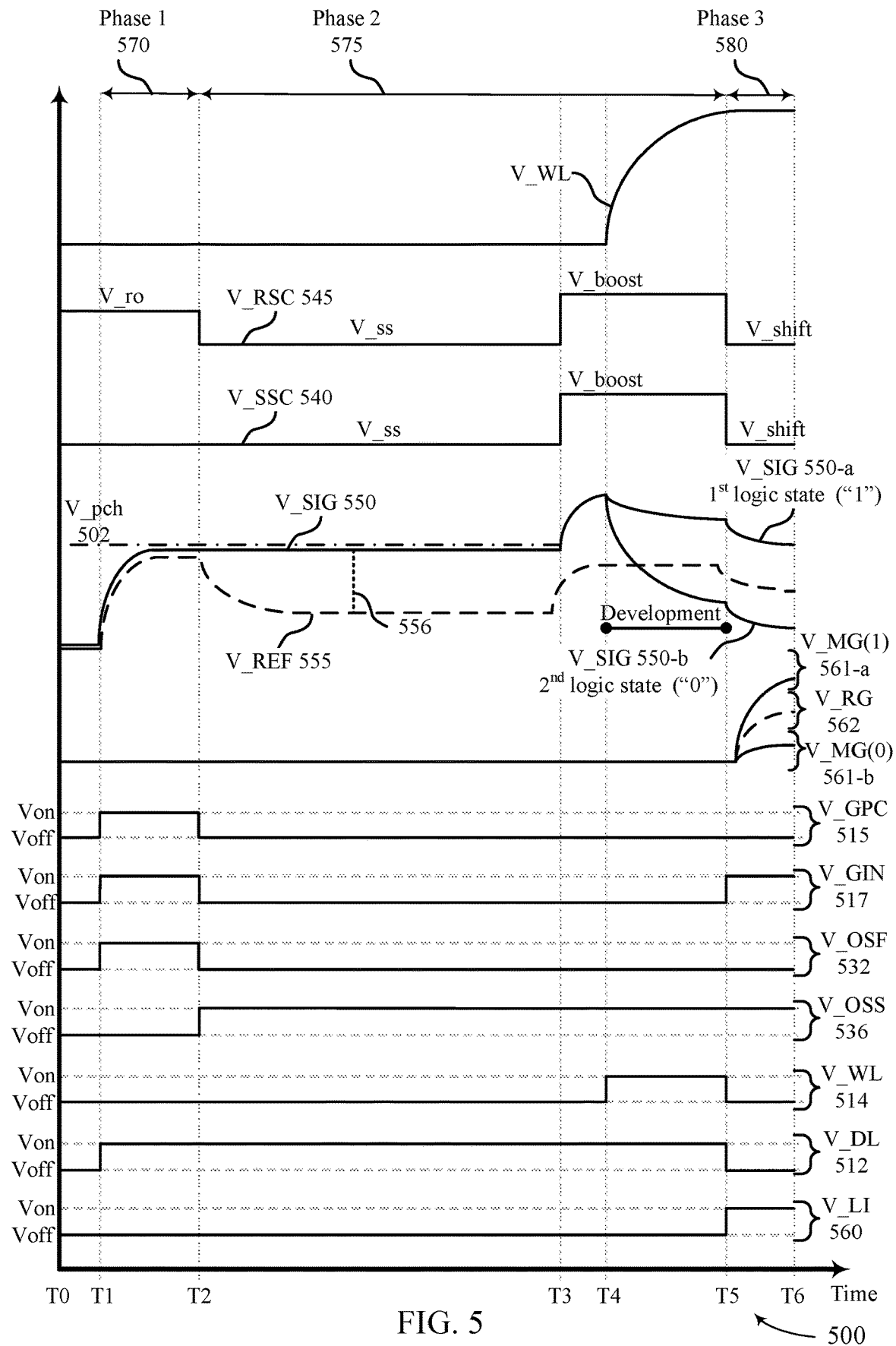
FIG. 5 illustrates an example of a timing diagram that supports techniques for read operations in accordance with examples as disclosed herein.

FIG. 5 illustrates a timing diagram 500 that supports techniques for read operations in accordance with examples as disclosed herein. The timing diagram 500 illustrates procedures of a read operation to sense a logic state stored on a memory cell 405. The timing diagram 500 shows various voltage levels (e.g., voltage signals as a function of time) associated with the components and the nodes of the circuit 400 described with reference to FIG. 4 to illustrate how the read operation may be performed. Thus, the timing diagram 500 may illustrate the operation of one or more components described herein with reference to FIGS. 1, 2, and 3. The time and voltage scales used in FIG. 5 are for illustration purposes only and may not necessarily depict particular values in some cases.

The timing diagram includes V_SIG 550 (e.g., a voltage of the signal node 450 described with reference to FIG. 4), V_REF 555 (e.g., a voltage of the reference node 455 described with reference to FIG. 4), V_pch 502 (e.g., a voltage of the precharge voltage source 402 described with reference to FIG. 4), V_SSC 540 (e.g., a voltage the signal shift component 440 described with reference to FIG. 4), V_RSC 545 (e.g., a voltage of the reference shift component 445 described with reference to FIG. 4), V_MG 561 (e.g., a voltage sampled to the first latch input 461 described with reference to FIG. 4) and V_RG 562 (e.g., a voltage sampled to the second latch input 462 described with reference to FIG. 4).

In some cases, the switches described with reference to FIG. 4 may be transistors or require an activation voltage to transition between active and inactive states, as used herein Von refers to a voltage greater than or equal to a transistor's threshold voltage to activate the transistor or an activation voltage required to active the switch. Similarly, Voff refers to a voltage less than a transistor's threshold voltage to deactivate the transistor or a deactivation voltage for a switch. Accordingly, the timing diagram 500 includes V_GPC 515 (e.g., a control voltage applied to precharge switches 415 as described with reference to FIG. 4), V_GIN 517 (e.g., a control voltage applied to input switches 417 described with reference to FIG. 4), V_OSF 532 (e.g., a control voltage applied to first offset switch 432 and second offset switch 434 described with reference to FIG. 4), V_OSS 536 (e.g., a control voltage applied to third offset switch 436 and fourth offset switch 438 described with reference to FIG. 4), V_WL 514 (e.g., a control voltage applied to word line transistor 407 described with reference to FIG. 4), V_DL 512 (e.g., a control voltage applied to digit line switch 412 described with reference to FIG. 4) and V_LI 560 (e.g., a control voltage applied to first latch switch 464 and second latch switch 465 described with reference to FIG. 4).

Before T1 (e.g., before precharging the signal node 450 and reference node 455), the reference shift component 445 may be activated to a reference offset voltage (e.g., V_ro), signal shift component 440 may be biased to a ground voltage (e.g., V_ss) and precharge voltage source 402 may be biased to a precharge voltage (e.g., V_pch).

At time T1, a first phase 570 (e.g., Phase 1) may begin and each transistor (e.g., signal transistor 421 and reference transistor 422) in the transistor pair 420 may compensate for the voltage threshold of the other transistor through charge sharing. For example, precharge switches 415, input switches 417, and first and second offset switches 432, 434 are activated. As a result, precharge voltage 402 subjected to the reference transistor 422 threshold drop is applied to signal node 450 and a precharge voltage 402 subjected to the signal transistor 421 threshold drop is applied to the reference node 455. Thus, at the end of the first phase the signal node 450 is storing a voltage that includes the threshold effect from the reference transistor 422 and the reference node 455 is storing a voltage that include a threshold effect from the signal transistor 421. During the first phase 570 precharge switches 415 may be activated—e.g., V_GPC 515 corresponds to Von—to bias the each of the gates of transistor pair 420 (e.g., gate of signal transistor 421 and gate of reference transistor 422) to a first precharge voltage (e.g., V_pch). Input switches 417 may be activated—e.g., V_GIN 517 corresponds to Von—and first offset switch 432 and second offset switch 434 may be activated—e.g., V_OSF 532 corresponds to Von—to couple precharge voltage source 402 to the signal node 450 via reference transistor 422 and first offset switch 432. Likewise, precharge voltage source 402 is coupled to reference output node 424 via signal transistor 421 and second offset switch 434. Accordingly, signal voltage 550 (V_SIG) at signal node 450 is charged to reference precharge voltage (V_pch)) and reference voltage 555 (V_REF) at reference node 455 is charged to precharge voltage (V_pch). At the end of the first phase 570, signal voltage 550 is offset from the precharge voltage (V_pch) by the reference transistor threshold (Vth_ref). For example, the signal voltage 550 at the signal node 450 is equal to the precharge voltage minus the reference transistor threshold—e.g., V_SIG=V_pch−Vth_ref. Similarly, at the end of the first phase 570, reference voltage 555 is offset from the precharge voltage (V_pch) by the signal transistor threshold (Vth_sig). For example, the reference voltage 555 at the reference node is equal to the precharge voltage minus the signal transistor threshold—e.g., V_REF=V_pch−Vth_sig.

In some cases, digit line switch 412 may be activated—e.g., V_DL 512 corresponds to Von—accordingly digit line may be coupled to signal node and be precharged to signal voltage 550 (e.g., Vpch−Vth_ref).

At time T2, a second phase 575 (e.g., Phase 2) may begin and the reference shift component 445 may be activated to decrease the reference voltage (V_REF) at the reference node 455 to offset the reference voltage (V_REF) from the signal voltage (V_SIG). This step may develop a reference voltage offset from the signal voltage that aids determination of the stored memory state based on a response of the reference voltage at a later phase of the read operation. During T2 of the second phase, precharge switches 415, input switches 417, first offset switch 432 and second offset switch 434 may be deactivated—e.g., V_GPC 515, V_GIN 517 and V_OSF 532 correspond to Voff—deactivating signal transistor 421 and reference transistor. Also, third offset switch 436 and fourth offset switch 438 may be activated—e.g., V_OSS corresponds to Von—biasing the gate of signal transistor 421 to signal voltage 550 and the gate of reference transistor 422 to reference voltage 555. Additionally, during the second phase 575 reference shift component 445 may be activated and driven driving the reference shift voltage 545 (e.g., V_RSC) to a ground voltage (V_ss). Accordingly, the reference node 455 may be discharged, decreasing the reference voltage 555 by offset voltage 556 from signal voltage 550.

At time T3 of the second phase 575, reference shift component 445 may be activated to increase the reference voltage and signal shift component 440 may be activated to increase the signal voltage before activating the world line transistor 407 to transfer a charge stored on memory cell 405 to the signal node 450. During T3 of the second phase, the reference shift component 445 may be activated to increase reference shift voltage 545 (e.g., V_RCS) to an increased voltage level (e.g., V_boost) thereby charging reference node 455 and increasing the reference voltage 555 biasing the gate of reference transistor 422. Similarly, signal shift component 440 may be activated to drive signal shift voltage 540 (e.g., V_SCS) to an increased voltage level (e.g., V_boost) thereby charging signal node 450 and increasing the signal voltage 550 biasing the gate of signal transistor 421.

At time T4 of the second phase 575, a charge indicating a memory state (e.g., logic 1 or logic 0) stored on memory cell 405 may be transferred to signal node 450. As a result, the signal voltage may change based on the charge stored on the memory cell 405. During T4 of the second phase word line transistor 407 may be activated—e.g., V_WL 514 corresponds to Von—to bias the gate of signal transistor 421 based on a charge stored at memory cell 405. That is, if a charge corresponding to a first logic state (e.g., logic 1) is stored on memory cell 405 then the signal voltage 550 may decrease according to a first signal voltage response 550-*a*. If a charge corresponding to a second logic state (e.g., logic 0) is stored on memory cell 405 then the signal voltage 550 may decrease according to a second signal voltage response 550-*b*.

At time T5 a third phase 580 (e.g., phase 3) may begin and the signal voltage at signal node 450 and the reference voltage at reference node 455 may be sampled to latch 460 by activating the transistor pair 420. During the third phase word line transistor 407 and digit line switch 412 may be deactivated—e.g., V_WL and V_DL correspond to Voff—thereby isolating memory cell 405 from the gate of signal transistor 421. Also, input switches 417 and latch switches 464, 465 may be activated—e.g., V_GIN 517 and V_LI 560 correspond to Von—activating signal transistor 421 and reference transistor 422 thereby sampling the signal voltage 550 to first latch input 461 and reference voltage 555 to second latch input 462.

Figure 6A:
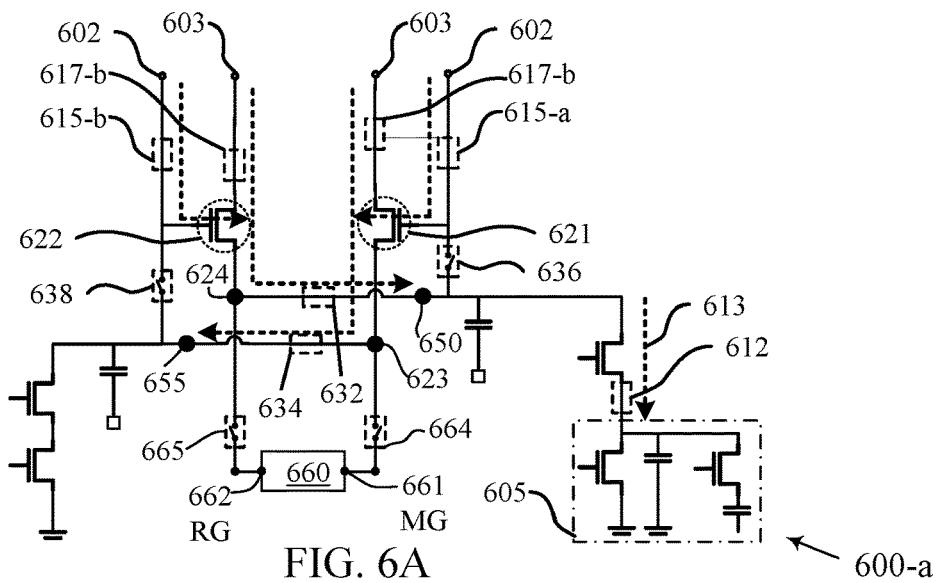
FIGS. 6A-6C illustrates an example of a circuit that supports techniques for read operations in accordance with examples as disclosed herein.
Figure 6B:
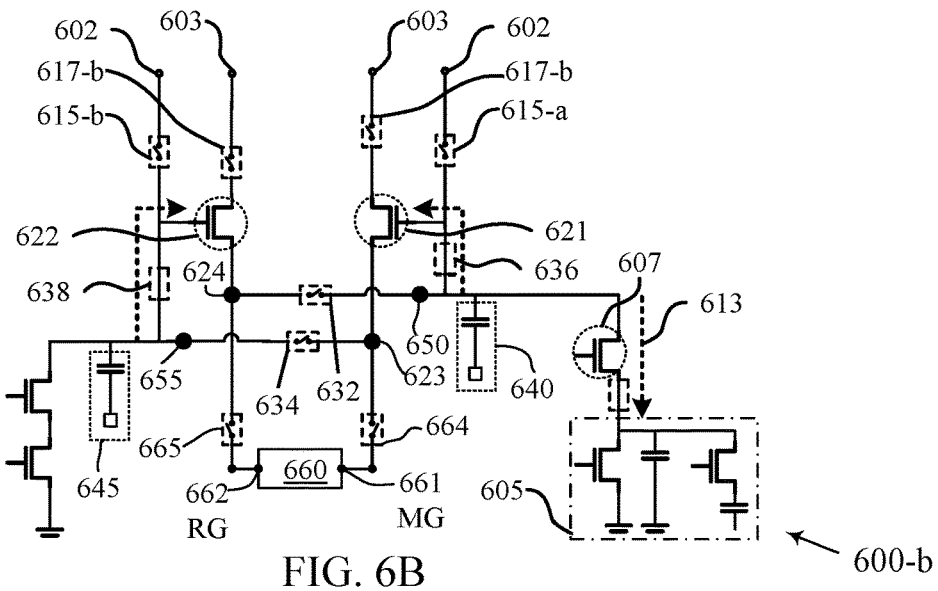
Figure 6C:
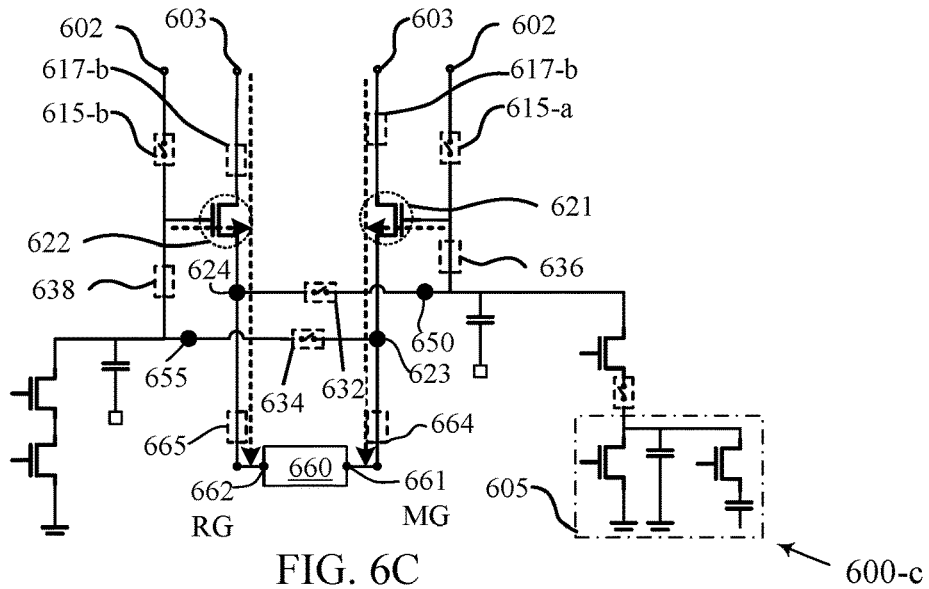

FIG. 6A-6C illustrate examples of the circuit 600 configurations (e.g., coupled and decoupled components) for each of the three phases discussed with reference to FIGS. 4 and 5 that support techniques for read operations in accordance with examples as disclosed herein. The circuit 600 may include one or more components described with reference to FIGS. 1-5. For example, circuit 600 may include a signal transistor 621, which may be an example of signal transistor 421 described with reference to FIG. 4, a reference transistor 622, which may be an example of reference transistor 422 described with reference to FIG. 4, precharge voltage source 602, which may be an example of precharge voltage source 402 described with reference to FIG. 4, or precharge voltage (Vpch) described with reference to FIG. 5, input voltage source 603, which may be an example of input voltage source 403 described with reference to FIG. 4, memory cell 605, which may be an example of memory cell 405 described with reference to FIG. 4, and signal node 650 and reference node 655, which may be examples of signal node 450 and reference node 455 described with reference to FIG. 4.

FIG. 6A illustrates circuit configuration 600-*a* that may be implemented for a first phase of a read operation. At the first phase, precharge switches 615, input switches 617, first offset switch 632, second offset switch 634 and digit line switch 612 may all be activated. As a result, precharge voltage source 602 and input voltage source 603 may be coupled to reference node 655 via signal transistor 621. Additionally or alternatively, precharge voltage source 602 and input voltage source 603 may be coupled to signal node 650 via reference transistor 622. In some cases, third offset switch 636 may be deactivated thereby decoupling signal node 650 from the gate of signal transistor 621 and fourth offset switch 638 may be deactivated thereby decoupling reference node 655 from the gate of reference transistor 622. In some cases, first latch switch 664 and second latch switch 665 may be deactivated thereby decoupling first latch input 661 from signal output node 623 and second latch input 662 from reference output node 624.

In some examples, signal transistor 621 and reference transistor 622 may each be a source follower circuit. In this regard, in the first phase configuration, precharge voltage (Vpch) may be transferred to signal node 650 via reference transistor 622. Accordingly, the voltage at signal node 650 may include an offset due to the reference transistor threshold (Vth_ref). In this regard, the voltage at signal node during the first phase may be estimated as Equation 1 shown below.

$$V\_SIG = V\text{pch} - V\text{th\_ref} \quad (1)$$

In some examples, precharge voltage (Vpch) may be transferred to reference node 655 via signal transistor 621. Accordingly, the voltage at reference node 655 may include an offset due to the signal transistor threshold (Vth_sig). In this regard, the voltage at reference node during the first phase may be estimated as Equation 2 shown below.

$$V\_REF = V\text{pch} - V\text{th\_sig.} \quad (2)$$

FIG. 6B illustrates circuit configuration 600-*b* that may be implemented for a second phase of a read operation. At the second phase, precharge switches 615, input switches 617 thereby decoupling precharge voltage source 602 and input voltage source 603 from circuit 600. First offset switch 632 and second offset switch 634 may be deactivated thereby decoupling signal output node 623 from reference node 655 and reference output node 624 from signal node 6. First and second latch switches 664, 665 may remain decoupled. Third offset switch 636 may be activated coupling signal node 650 to the gate of signal transistor 621 and fourth offset switch 638 may be activated coupling reference node 655 to the gate of reference transistor 622.

In some examples, signal shift component 640 may apply a voltage increase (e.g., V_boost) to signal node 650, such as described with reference to signal shift component 440 described in FIGS. 4 and 5. Reference shift component 645 may also apply a voltage shift (e.g., Vref_shift) and voltage increase (e.g., V_boost) to reference node 655, such as described with reference to reference shift component 445 in FIGS. 4 and 5. In some cases, word line transistor 607 may also be activated applying a stored voltage (V_mem) from memory cell 605 on signal node 650.

Activating third offset switch 636 may bias the gate of signal transistor 621 to include the voltage on signal node 650 (e.g., V_pch−Vth_ref), the voltage increase from signal shift component 640 (e.g., V_boost) and the voltage from memory cell 605 (V_mem). Accordingly, at the second phase, the voltage biasing the gate of signal transistor 621 may be estimated as Equation 3 shown below.

$$V\_SIG = V\_pch - Vth\_ref - \Delta V\_mem + V\_boost \quad (3)$$

Activating fourth offset switch 638 may bias the gate of reference transistor 622 to include the voltage on reference node 655 (e.g., V_pch−Vth_sig), the reference shift voltage from the reference shift component 645 (e.g., Vref_shift) and the voltage increase from reference shift component 645 (e.g., V_boost). Accordingly, at the second phase, the voltage biasing the gate of reference transistor 622 may be estimated as Equation 4 shown below.

$$V\_REF = V\_pch - Vth\_ref - Vref\_shift + V\_boost \quad (4)$$

FIG. 6C illustrates circuit configuration 600-c that may be implemented for a third phase of a read operation. At the third phase, precharge switches 615, first offset switch 632 and second offset switch 634 may remain deactivated. Input switches 617 may be re-activated thereby activating signal transistor 621 and reference transistor 622. First latch switch 664 may be activated coupling signal output node 623 to first latch input 661 and second latch switch 665 may be activated coupling reference output node 624 to second latch input 662. In some cases, digit line switch 612 may be deactivated decoupling memory cell 605 from signal node 650.

Activating signal transistor 621 and first latch switch 664 samples the voltage at the gate of signal transistor 621 to first latch input 661, which may include the signal transistor threshold (Vth_sig). Accordingly, at the third phase, the voltage sampled to the first latch input 661 may be estimated as Equation 5 shown below.

$$SIG = V\_pch - Vth\_ref - Vth\_sig - \Delta V\_mem + V\_boost \quad (5)$$

Activating reference transistor 622 and second latch switch 665 samples the voltage at the gate of reference transistor 622 to second latch input 662, which may include the reference threshold voltage (Vth_ref). Accordingly, at the third phase, the voltage sampled to the second latch input may be estimated as Equation 6 as shown below.

$$REF = V\_pch - Vth\_ref - Vth\_sig - Vref\_shift + V\_boost \quad (6)$$

In some cases, the difference between the signal voltage and the reference voltage may be determined to be V_SIG−V_REF. Notably, the precharge voltage (Vpch), reference transistor threshold (Vth_ref), signal transistor threshold (Vth_sig) and voltage increase (V_boost) cancel out. Thus, the voltage difference can be estimate as Equation 7 as shown below.

$$DIFF = \Delta V\_mem - Vref\_shift \quad (7)$$

In some examples, a logic state stored on memory cell 605 may be determined based on the value of V_Diff. For example, if V_Diff falls within a first set of values, the memory device may be determined to store a first logic state (e.g., logic 1) and if V_Diff falls within a second set of values, the memory device may be determined to store a second logic state (e.g., logic 0).

Figure 7:
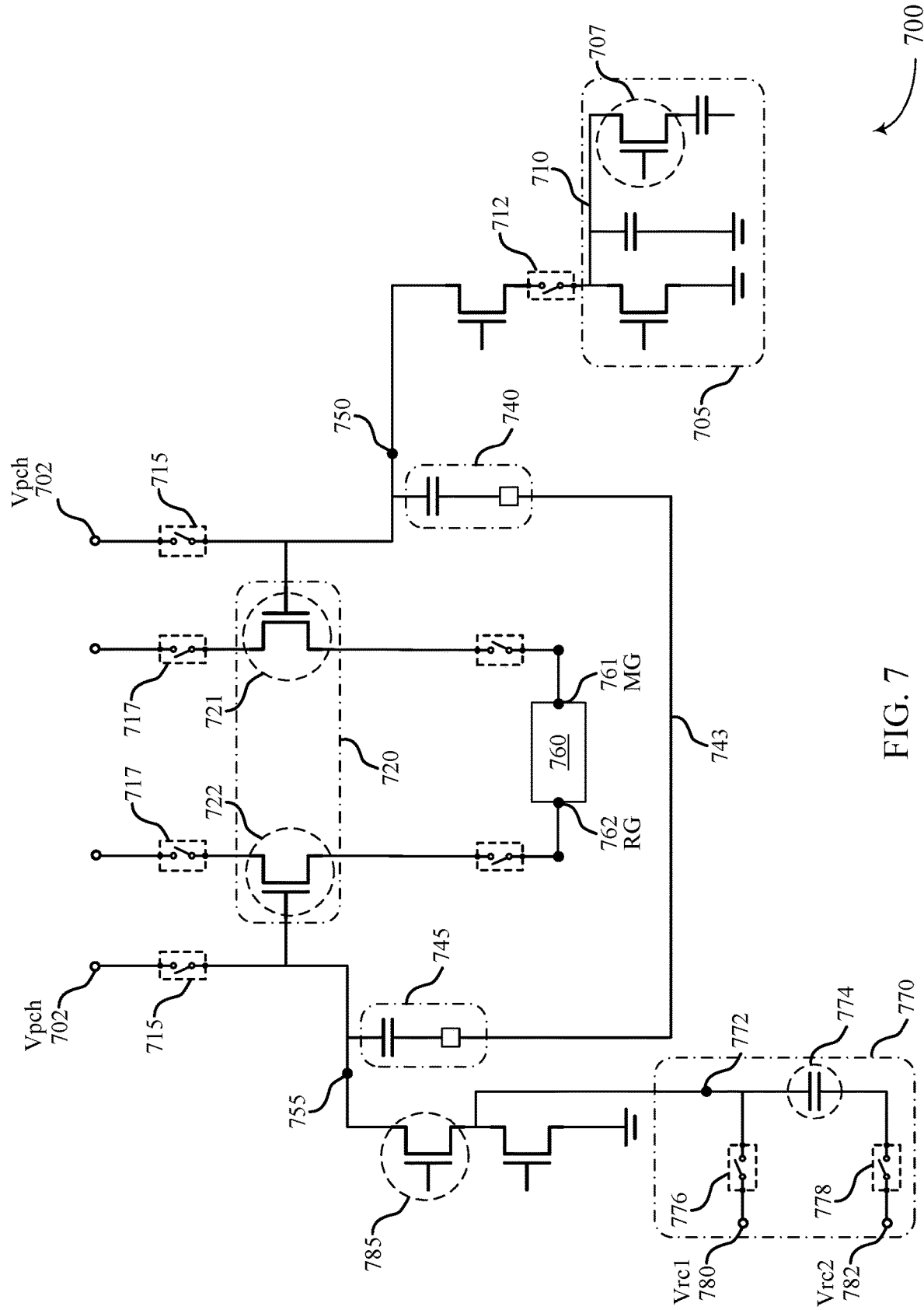
FIG. 7 illustrates an example of a circuit that supports techniques for read operations in accordance with examples as disclosed herein.

FIG. 7 illustrates an example of a circuit 700 that supports techniques for read operations in accordance with examples as disclosed herein. The circuit illustrates how a capacitive reference component 770 may be coupled with a sensing circuit for sampling a voltage stores on memory cell 705 to a latch 760. The capacitive reference component 770 may develop a voltage response on reference node 755 similar to the voltage response on a signal node 750 from a digit line 710. In some aspects the capacitive reference component 770 may eliminate the need for a reference shift component 745 to shift a reference voltage before sampling to a latch, for example, such as the shift process implemented by reference shift component 445 or 645 which are described in relation to FIGS. 4-6. Accordingly, variability in a sense process may be reduced by removing differences between voltage responses on separate shift components (e.g., signal shift component 440 or 640 that is independent from reference shift component 445 or 645 as described with reference to FIGS. 4-6).

Circuit 700 may include one or more components described with reference to FIGS. 1-6. For example, circuit 700 may include a memory cell 705, which may be an example memory cell 205 described with reference to FIG. 2 or memory cell 405 described with reference to FIG. 4; a digit line 710, which may be an example of digit line 215 as described with reference to FIG. 2; a transistor pair 720; one or more shift components (e.g., signal shift component 740 or reference shift component 745); a capacitive reference component 770; and a latch 760. The circuit 700 may also include precharge voltage source 702, a first reference voltage source 780 (Vrc1) and a second reference voltage source 782 (Vrc2).

Circuit 700 may be configured in a variety of ways to implement reference voltage adjustment. For example, in one implementation, capacitive reference component 770 may include a first source switch 776 to selectively couple capacitive reference node 772 to a first reference voltage source 780. In this example, a second source switch 778 may be a static connection to second reference voltage source 782, for example, reference capacitor 774 may be coupled directly to a ground voltage (e.g., Vss). In a second implementation, first source switch 776 may be replaced with a static connection and second source switch 778 may selectively couple and decouple second reference voltage source 782 to reference capacitor 774 (and capacitive reference node 772). In some cases, second reference voltage source 782 may be a ground voltage (Vss).

In a first phase (e.g., precharge phase), circuit 700 may be configured to bias transistor pair 720 to a first precharge voltage (e.g., Vpch). In some cases, at the first phase, the precharge switches 715 may be activated to couple precharge voltage source 702 with the gates of signal transistor 721 and reference transistor 722. Input switches 717 may be deactivated, and thus, transistor pair 720 may be inactive (e.g., not transferring any charge). Further, at the first phase, signal shift component 740 may be coupled with reference shift component 745 (e.g., grounded together). In some cases, a first transistor 785 is also deactivated thereby decoupling capacitive reference component 770 from reference node 755.

Accordingly, during the first phase, the voltage at reference node 755 may increase to the precharge voltage source level (Vpch) and the voltage at signal node 750 may also increase to the precharge voltage source level (Vpch). In some cases, digit line switch 712 may be active thereby coupling digit line 710 to signal node 750. Accordingly, the voltage at digit line 710 will increase to a digit line voltage, which may be less than the precharge voltage (Vpch), for example due to the capacitive characteristic of digit line 710.

In a first implementation of capacitive reference component 770, first source switch 776 may be activated coupling capacitive reference node 772 to first reference voltage source 780 and second source switch may be a static connection to a ground voltage (e.g., Vss). Thus, reference capacitor 774 may be charged by first reference voltage source 780 and capacitive reference node 772 may charge to the first reference voltage source level (e.g., Vcrl).

In a second implementation of capacitive reference component 770, first source switch 776 may be a static connection to first reference voltage source 780 and second source switch 778 may be deactivated and thus capacitive reference node 772 is decoupled from second reference voltage source 782. In this implementation, reference capacitor 774 may be charged by first reference voltage source 780 and capacitive reference node 772 may charge to the first reference voltage source level (e.g., Vcrl).

In the first implementation of capacitive reference component 770, first source switch 776 may have been deactivated before entering a second phase, thereby decoupling capacitive reference node 772 from first reference voltage source 780. In the second implementation of capacitive reference component 770, second source switch 778 may be activated before entering the second phase, thereby coupling capacitive reference node 772 to second reference voltage source 782, which may be a ground voltage (e.g., Vss).

At a second phase (e.g., phase 2), circuit 700 may be configured to develop a signal voltage at signal node 750 and a reference voltage at reference node 755 before sampling the signal and reference voltages to latch 760. In this regard, at the second phase, the precharge switches 715 may be deactivated decoupling precharge voltage source from the gates of transistor pair 720. Signal shift component 740 and reference shift component 745 may transfer a charge to signal node 750 and reference node 755 increasing/boosting the voltage level on the nodes. At the second phase, and after the signal shift component 740 and reference shift component 745 have increased the voltage on signal node 750 and reference node 755, word line transistor 707 may be activated coupling memory cell 705 to signal node 750. Accordingly, the voltage level at signal node 750 may be shifted based on a logic value stored at memory cell 705. In relation to activating word line transistor 707, first transistor 785 may also be activated coupling capacitive reference node 772 to reference node 755. In this regard, the voltage level on signal node 750 may decrease based on a capacitive property of digit line 710, and the voltage level on reference node 755 may decrease based on a capacitive property of capacitive reference component 770. Accordingly, the capacitive effect of capacitive reference node 772 can be configured to develop a reference voltage response that is between a first voltage response at signal node 750 (e.g., in response to a first logic state stored at memory cell 705) and second voltage response at signal node 750 (e.g., in response to a second logic state stored at memory cell 705).

In some cases, a third stage may include sampling the voltage at signal node 750 and reference node 755 to latch 760. For example, sampling may occur as described with reference to FIGS. 4-6. Although, a first configuration of circuit 700 is shown, other implementations may include different circuit configurations. For example, the offset circuit described with reference to FIGS. 4-6 could be implement with the capacitive reference component 770 as described with refence to FIG. 7.

Figure 8:
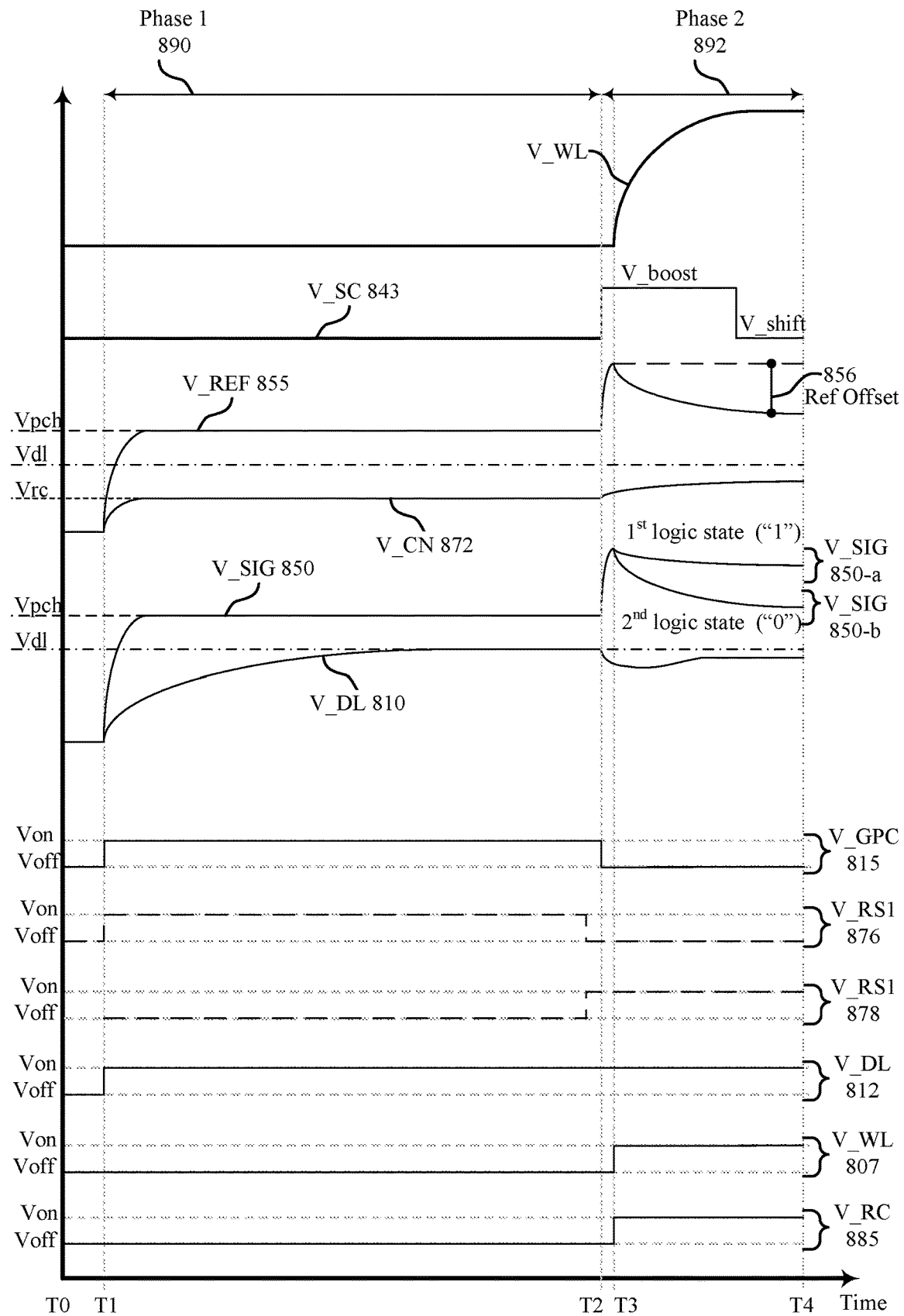
FIG. 8 illustrates an example of a timing diagram that supports techniques for read operations in accordance with examples as disclosed herein.

FIG. 8 illustrates an example of a timing diagram 800 that supports techniques for read operations in accordance with examples as disclosed herein. The timing diagram 800 illustrates procedures of a read operation to sense a logic state stored on a memory cell. The timing diagram 800 shows various voltage levels (e.g., voltage signals as a function of time) associated with the components and the nodes of the circuit 700 described with reference to FIG. 7 to illustrate how the read operation may be performed. Thus, the timing diagram 800 may illustrate the operation of one or more components described herein with reference to FIGS. 1, 2, and 3. The time and voltage scales used in FIG. 8 are for illustration purposes only and may not necessarily depict particular values in some cases.

The timing diagram includes V_SIG 850 (e.g., a voltage of the signal node 750 described with reference to FIG. 7), V_REF 855 (e.g., a voltage of the reference node 755 described with reference to FIG. 7), Vpch (e.g., a voltage of the precharge voltage source 702 described with reference to FIG. 7), V_SC 843 (e.g., a voltage of the signal shift component 740 and reference shift component 745 described with reference to FIG. 7), V_CN 872 (e.g., a voltage of the capacitive reference node 772 described with reference to FIG. 7), and V_DL 810 (e.g., a voltage of the digit line 710 described with reference to FIG. 7).

In some cases, the switches described with reference to FIG. 7 may be transistors or require an activation voltage to transition between active and inactive states, as used herein Von refers to a voltage greater than or equal to a transistor's threshold voltage to activate the transistor or an activation voltage required to active the switch. Similarly, Voff refers to a voltage less than a transistor's threshold voltage to deactivate the transistor or a deactivation voltage for a switch. Accordingly, the timing diagram 800 includes V_GPC 815 (e.g., a control voltage applied to precharge switches 715 as described with reference to FIG. 7), V_RS1 876 (e.g., a control voltage applied to first source switch 776 in a first implementation of capacitive reference component 770 described with reference to FIG. 7), V_RS2 878 (e.g., a control voltage applied to second source switch 778 in a second implementation of capacitive reference component 770 described with reference to FIG. 7), V_DL 812 (e.g., a control voltage applied to digit line switch 712 described with reference to FIG. 7), V_WL 807 (e.g., a control voltage applied to word line transistor 707 described with reference to FIG. 7), and V_RC 885 (e.g., a control voltage applied to first transistor 785 described with reference to FIG. 7).

Before T1 (e.g., before precharging the signal node 750 and reference node 755) circuit 700 may be at a low or ground voltage.

At time T1 a first phase 890 (e.g., Phase 1) may begin by signal node 750 and reference node 755 being precharged to precharge voltage (Vpch). Additionally, capacitive reference node 752 may be precharged to a reference offset voltage (Vrc) and digit line 710 may be charged to a digit line voltage (Vdl). The reference offset voltage (Vrc) may be set to develop a reference voltage response (e.g., V_REF 855) that is similar to the capacitive characteristics of digit line 710. Thus, the reference node 755 may have a similar capacitive response to the signal node 750. During T1 of the first phase precharge switches 715 may be activated—e.g., V_GPC 815 corresponds to Von—coupling signal node 750 and reference node 755 to precharge voltage source 702. In this regard, signal voltage 850 (V_SIG) at signal node 750 increase to Vpch and reference voltage 855 (V_REF) at reference node 755 increases to Vpch. Digit line switch 712 may also be activated—V_DL 812 corresponds to Von—coupling digit line 710 to signal node 750 In this regard, digit line voltage 810 increase to Vdl.

Also, in a first implementation, first source switch 776 may be activated—e.g., V_RS1 corresponds to Von—coupling first reference voltage source 780 to capacitive reference node 772. In a second implementation, second source switch 778 may be deactivated—e.g., V_RS2 corresponds to Voff—decoupling second reference voltage source 782 from capacitive reference node 772. In either event, the capacitive reference node voltage 872 (V_CN) at capacitive reference node 772 increases to Vrc (e.g., the voltage of first reference voltage source 780).

Before transitioning to the second phase at T2, but after V_SIG 850, V_REF 855, V_DL 810 and V_CN 872 have reached a steady state or a set time has passed, first source switch 776 or second source switch 778 may be activated or deactivated based on the implementation. For example, in the first implementation, the first source switch 776 is deactivated—e.g., V_RS1 corresponds to Voff—decoupling first reference voltage source 780 from capacitive reference node 772. In the second implementation, second source switch 778 is activated—e.g., V_RS2 corresponds to Von—coupling second reference voltage source 782 (e.g., Vss) to capacitive reference node 772.

At time T2, the second phase 892 (e.g., Phase 2) may begin by activating signal shift component 740 and/or reference shift component 745, which may be short circuited, to increase the voltage level at both the signal node 750 and reference node 755 by the same amount. Precharge switches 715 may be deactivated—e.g., V_GPC 815 corresponds to Voff—decoupling precharge voltage source from signal node 750 and reference node 755. Also, signal shift component 740 and/or reference shift component 745 may activate a boost signal 843 (V_SC increases to V_boost) increasing the voltage of each of signal node 750 and reference node 755. Accordingly, the signal voltage 850 (V_SIG) and reference voltage 855 (V_REF) may increase based on the boost voltage (V_boost).

At time T3, a charge indicating a memory state (e.g., logic 1 or logic 0) stored on memory cell 705 may be transferred to signal node 750. As a result, the signal voltage (e.g., V_SIG 850) may change based on the charge stored on the memory cell 705. During T3 word line transistor 707 may be activated—e.g., V_WL 807 corresponds to Von—coupling memory cell 705 to signal node 750. As a result, a charge stored on memory cell representing a logic state may cause a decrease in the signal voltage 850 in based on the logic state that was stored on memory cell 705. For example, if a first logic state (e.g., logic 1) was stored on memory device, signal voltage 850 may decrease according to a first response—e.g., V_SIG 850-*a*. If a second logic state (e.g., logic 1) was stored on memory device, signal voltage 850 may decrease according to a second voltage response—e.g., V_SIG 850-*b*. Also, at T3 first transistor 785 may be activated—e.g., V_RC corresponds to Von—coupling capacitive reference node 772 to reference node 755. As a result, the reference voltage 855 (V_REF) may decrease in relation to the capacitive reference node voltage 872 (V_CN) stored at reference capacitor 774. For example, capacitive reference node 772 may pull charge from reference node 755. In this regard, reference voltage may decrease according to reference voltage 855 response and develop reference offset 856. Reference offset 856 may be set by adjusting one or more parameter of capacitive reference component 770 (e.g., properties of reference capacitor 774, first reference voltage source 780, second reference voltage source 782, or a combination thereof). Further, reference offset 856 may be set to aid determination of the logic state stored at memory cell 705. For example, reference voltage 855 may be set to be substantially half way between first signal voltage response 850-*a* (e.g., logic state 1) and second signal voltage response 850-*b* (e.g., logic state 0).

At time T4 circuit 700 may sample signal voltage 850 and reference voltage 855 to latch 760. This may occur as described with reference to FIGS. 4-6, or according to another sense operation.

Figure 9:
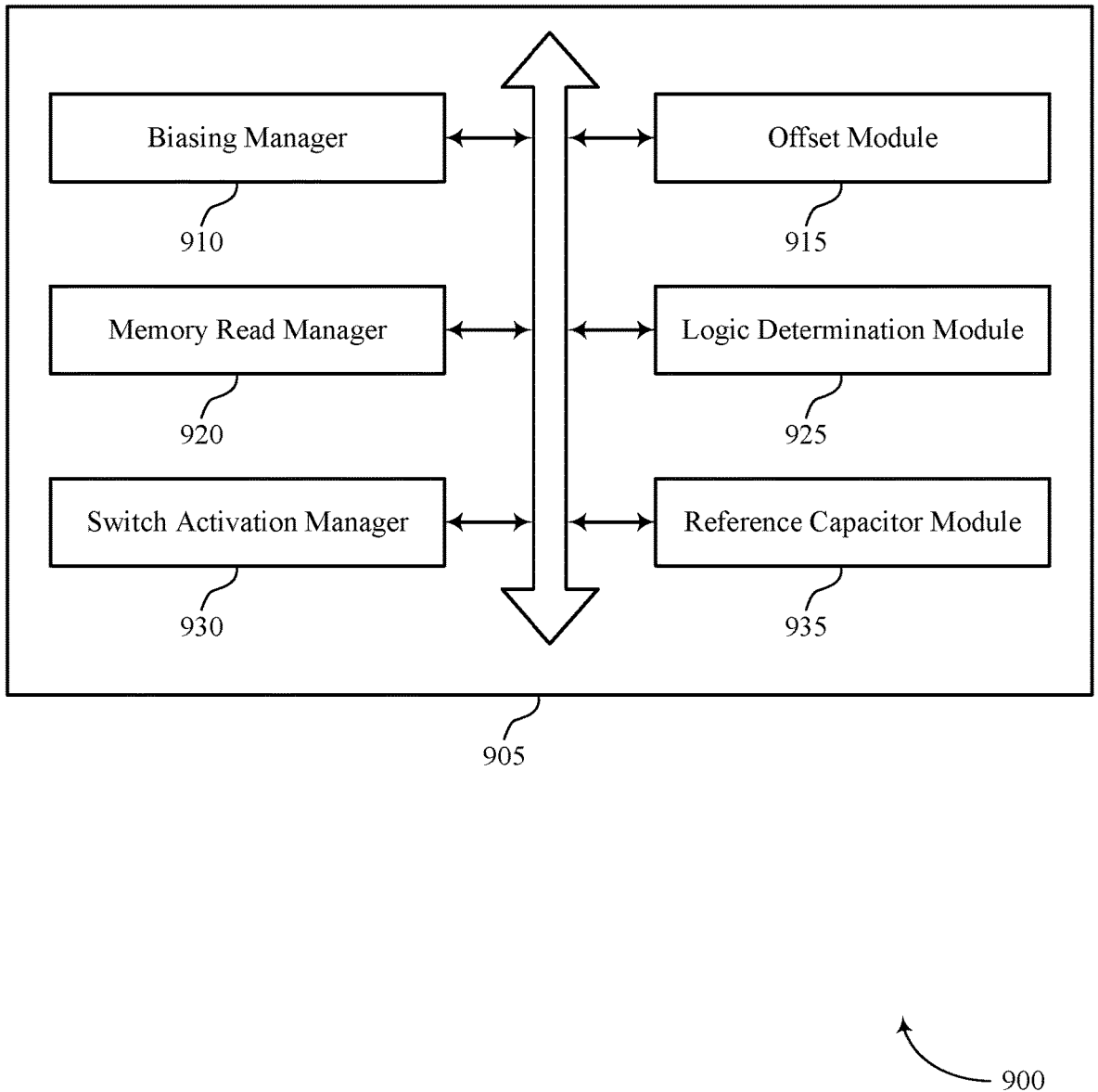
FIG. 9 shows a block diagram of a memory device that supports techniques for read operations and reference voltage adjustment in accordance with aspects of the present disclosure.

FIG. 9 shows a block diagram 900 of a memory device 905 that supports techniques for read operations in accordance with examples as disclosed herein. The memory device 905 may be an example of aspects of a memory device as described with reference to FIGS. 1 through 8. The memory device 905 may include a biasing manager 910, an offset module 915, a memory read manager 920, a logic determination module 925, a switch activation manager 930, and a reference capacitor module 935. Each of these modules may communicate, directly or indirectly, with one another (e.g., via one or more buses).

The biasing manager 910 may bias a first gate of a first transistor to a first voltage. In some examples, the biasing manager 910 may bias a second gate of a second transistor to a third voltage based on coupling the memory cell with the first node.

The offset module 915 may precharge a first node to a second voltage based on biasing the first gate of the first transistor to the first voltage, the second voltage being based on the first voltage and on a first threshold voltage of the first transistor. In some examples, the offset module 915 may apply a fourth voltage to a second node coupled with a latch and the second transistor based on applying the third voltage to the second gate of the second transistor, the fourth voltage being based on the third voltage and a second threshold voltage of the second transistor.

The memory read manager 920 may couple a memory cell with the first node precharged to the second voltage based on precharging the first node. In some examples, the memory read manager 920 may apply a reference voltage to a latch during the read operation based on coupling the first node to the second node.

The logic determination module 925 may determine a logic state stored on the memory cell based on applying the fourth voltage to the second node coupled with the latch.

The switch activation manager 930 may couple a first node to a first voltage source to increase the first node to a first voltage level as part of a read operation of a memory cell. In some examples, the switch activation manager 930 may couple a second node to a second voltage source to increase the second node to a second voltage level as part of the read operation of the memory cell. The switch activation manager 930 may couple the first node with the second node based on applying the voltage increase to the first capacitor.

The reference capacitor module 935 may apply a voltage increase to a first capacitor coupled with the first node to increase a third voltage level of the first node based on coupling the first node to the first voltage source.

Figure 10:
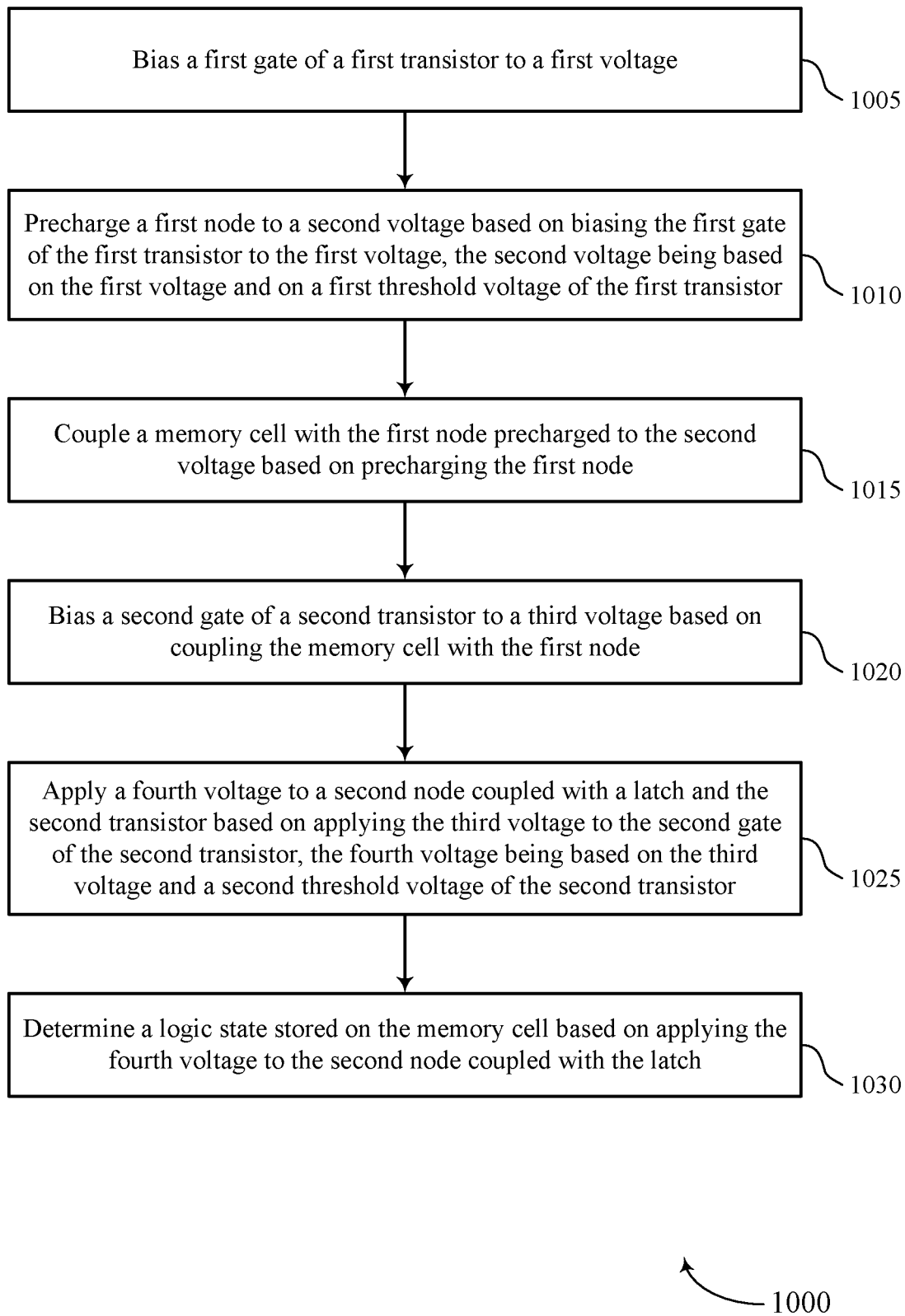
FIGS. 10 and 11 show flowcharts illustrating a method or methods that support techniques for read operations in accordance with examples as disclosed herein.

FIG. 10 shows a flowchart illustrating a method or methods 1000 that supports techniques for read operations in accordance with aspects of the present disclosure. The operations of method 1000 may be implemented by a memory device or its components as described herein. For example, the operations of method 1000 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1005, the memory device may bias a first gate of a first transistor to a first voltage. The operations of 1005 may be performed according to the methods described herein. In some examples, aspects of the operations of 1005 may be performed by a biasing manager as described with reference to FIG. 9.

At 1010, the memory device may precharge a first node to a second voltage based on biasing the first gate of the first transistor to the first voltage, the second voltage being based on the first voltage and on a first threshold voltage of the first transistor. The operations of 1010 may be performed according to the methods described herein. In some examples, aspects of the operations of 1010 may be performed by an offset module as described with reference to FIG. 9.

At 1015, the memory device may couple a memory cell with the first node precharged to the second voltage based on precharging the first node. The operations of 1015 may be performed according to the methods described herein. In some examples, aspects of the operations of 1015 may be performed by a memory read manager as described with reference to FIG. 9.

At 1020, the memory device may bias a second gate of a second transistor to a third voltage based on coupling the memory cell with the first node. The operations of 1020 may be performed according to the methods described herein. In some examples, aspects of the operations of 1020 may be performed by a biasing manager as described with reference to FIG. 9.

At 1025, the memory device may apply a fourth voltage to a second node coupled with a latch and the second transistor based on applying the third voltage to the second gate of the second transistor, the fourth voltage being based on the third voltage and a second threshold voltage of the second transistor. The operations of 1025 may be performed according to the methods described herein. In some examples, aspects of the operations of 1025 may be performed by an offset module as described with reference to FIG. 9.

At 1030, the memory device may determine a logic state stored on the memory cell based on applying the fourth voltage to the second node coupled with the latch. The operations of 1030 may be performed according to the methods described herein. In some examples, aspects of the operations of 1030 may be performed by a logic determination module as described with reference to FIG. 9.

Figure 11:
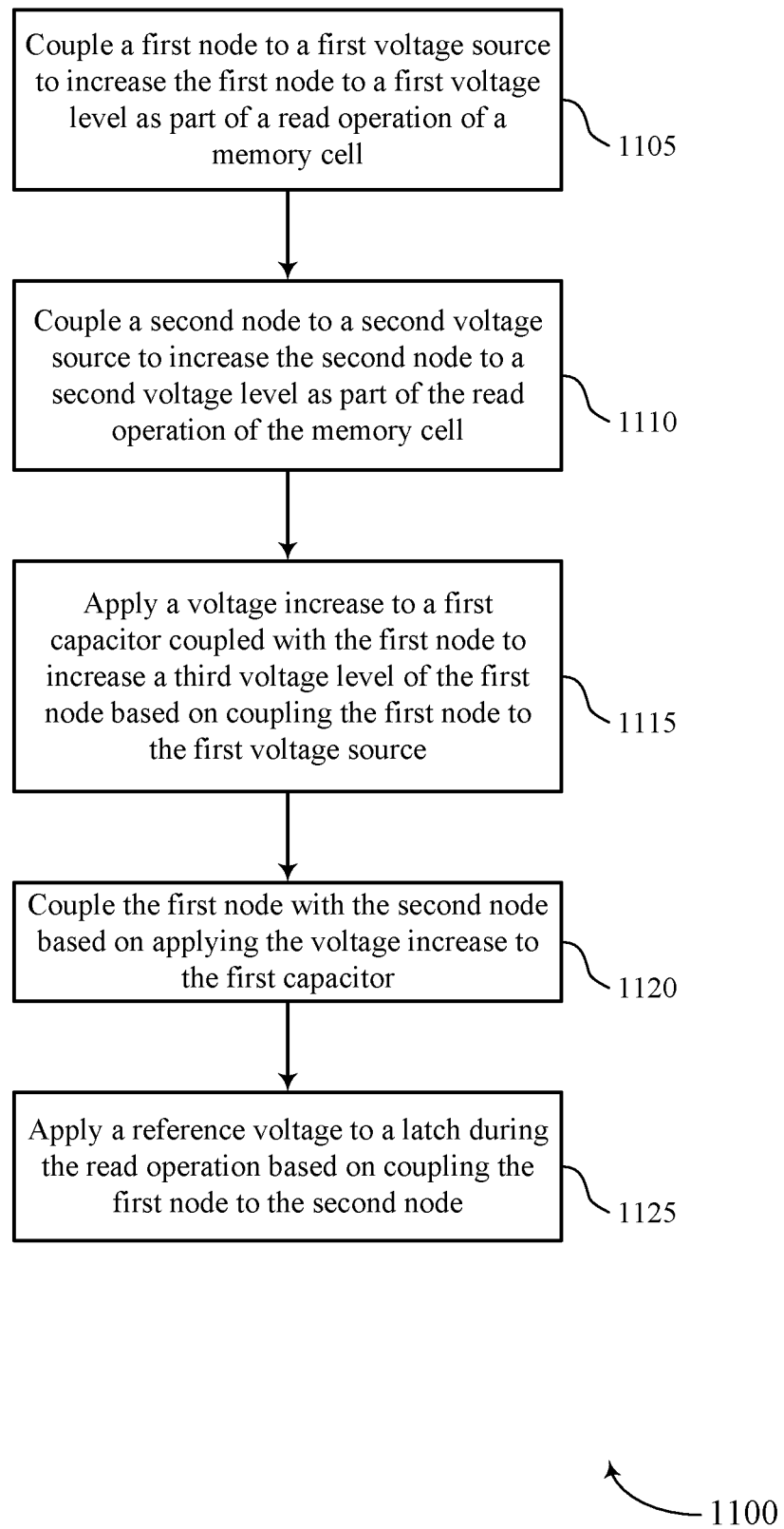

FIG. 11 shows a flowchart illustrating a method or methods 1100 that supports techniques for read operations in accordance with aspects of the present disclosure. The operations of method 1100 may be implemented by a memory device or its components as described herein. For example, the operations of method 1100 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1105, the memory device may couple a first node to a first voltage source to increase the first node to a first voltage level as part of a read operation of a memory cell. The operations of 1105 may be performed according to the methods described herein. In some examples, aspects of the operations of 1105 may be performed by a switch activation manager as described with reference to FIG. 9.

At 1110, the memory device may couple a second node to a second voltage source to increase the second node to a second voltage level as part of the read operation of the memory cell. The operations of 1110 may be performed according to the methods described herein. In some examples, aspects of the operations of 1110 may be performed by a switch activation manager as described with reference to FIG. 9.

At 1115, the memory device may apply a voltage increase to a first capacitor coupled with the first node to increase a third voltage level of the first node based on coupling the first node to the first voltage source. The operations of 1115 may be performed according to the methods described herein. In some examples, aspects of the operations of 1115 may be performed by a reference capacitor module as described with reference to FIG. 9.

At 1120, the memory device may couple the first node with the second node based on applying the voltage increase to the first capacitor. The operations of 1120 may be performed according to the methods described herein. In some examples, aspects of the operations of 1120 may be performed by a switch activation manager as described with reference to FIG. 9.

At 1125, the memory device may apply a reference voltage to a latch during the read operation based on coupling the first node to the second node. The operations of 1125 may be performed according to the methods described herein. In some examples, aspects of the operations of 1125 may be performed by a memory read manager as described with reference to FIG. 9.

In some examples, an apparatus as described herein may perform a method or methods, such as the method 1100. The apparatus may include features, means, or instructions (e.g., a non-transitory computer-readable medium storing instructions executable by a processor) for coupling a first node to a first voltage source to increase the first node to a first voltage level as part of a read operation of a memory cell, coupling a second node to a second voltage source to increase the second node to a second voltage level as part of the read operation of the memory cell, applying a voltage increase to a first capacitor coupled with the first node to increase a third voltage level of the first node based on coupling the first node to the first voltage source, coupling the first node with the second node based on applying the voltage increase to the first capacitor, and applying a reference voltage to a latch during the read operation based on coupling the first node to the second node.

Some examples of the method 1100 and the apparatus described herein may further include operations, features, means, or instructions for isolating the second node from the second voltage source by deactivating a first transistor before coupling the first node to the second node.

Some examples of the method 1100 and the apparatus described herein may further include operations, features, means, or instructions for coupling the second node to a fourth voltage source by activating a second transistor before coupling the first node to the second node.

Some examples of the method 1100 and the apparatus described herein may further include operations, features, means, or instructions for precharging a second capacitor coupled with the second node based on the third voltage level associated with a digit line coupled with the first node.

Some examples of the method 1100 and the apparatus described herein may further include operations, features, means, or instructions for coupling, as part of the read operation, a third node associated with the memory cell to a third voltage source to increase the third voltage level of the third node, and coupling the third node to a digit line to increase a fourth voltage level of the digit line.

Some examples of the method 1100 and the apparatus described herein may further include operations, features, means, or instructions for applying the voltage increase to a third capacitor coupled with the third node based on coupling the third node to the digit line.

Some examples of the method 1100 and the apparatus described herein may further include operations, features, means, or instructions for applying a fifth voltage indicating a logic state stored on the memory cell to the latch during the read operation based at least in part applying the voltage increase to the first capacitor and the third capacitor.

Some examples of the method 1100 and the apparatus described herein may further include operations, features, means, or instructions for determining the logic state stored on the memory cell based on comparing the fifth voltage to the reference voltage.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive.

A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
biasing a first gate of a first transistor to a first voltage;
precharging a first node to a second voltage based at least in part on biasing the first gate of the first transistor to the first voltage, the second voltage being based at least in part on the first voltage and on a first threshold voltage of the first transistor;
coupling a memory cell with the first node precharged to the second voltage based at least in part on precharging the first node;
biasing a second gate of a second transistor to a third voltage based at least in part on coupling the memory cell with the first node; and
applying a fourth voltage to a second node coupled with a latch and the second transistor based at least in part on applying the third voltage to the second gate of the second transistor, the fourth voltage being based at least in part on the third voltage and a second threshold voltage of the second transistor.

2. The method of claim 1, further comprising:
determining a logic state stored on the memory cell based at least in part on applying the fourth voltage to the second node coupled with the latch.

3. The method of claim 1, further comprising:
activating a third transistor to couple the first transistor with the first node, wherein precharging the first node is based at least in part on activating the third transistor; and
activating a fourth transistor, after activating the third transistor, to couple the first node with the second gate of the second transistor, wherein biasing the second gate of the second transistor is based at least in part on activating the fourth transistor.

4. The method of claim 1, wherein:
the first transistor is associated with a reference voltage supplied to the latch during a read operation of the memory cell; and
the second transistor is associated with the fourth voltage indicating a logic state stored in the memory cell and supplied to the second node of the latch during the read operation of the memory cell.

5. The method of claim 1, further comprising:
biasing the second gate of the second transistor to the first voltage before biasing the second gate to the third voltage; and
precharging a third node to a fifth voltage based at least in part on biasing the second gate of the second transistor to the first voltage, wherein the fifth voltage is based at least in part on the first voltage and on the second threshold voltage of the second transistor.

6. The method of claim 5, further comprising, before applying the forth voltage to the second node:
applying a sixth voltage to a first capacitor coupled with the first node after precharging the first node, wherein the sixth voltage causes the third voltage applied to the second gate of the second transistor to increase to a seventh voltage; and
applying an eighth voltage to a second capacitor coupled with the third node after precharging the third node, wherein the eighth voltage causes the fifth voltage applied to the first gate of the first transistor to increase to a ninth voltage.

7. The method of claim 6, further comprising:
applying a tenth voltage to a fourth node coupled with the latch, wherein the tenth voltage is based at least in part on the ninth voltage and the first threshold voltage of the first transistor;
comparing the fourth voltage applied to the second node coupled with the latch to the tenth voltage applied to the fourth node coupled with the latch; and
determining a logic state stored on the memory cell based at least in part on comparing the fourth voltage with the tenth voltage, wherein the fourth voltage is based at least in part on the seventh voltage and the second threshold voltage of the second transistor.

8. The method of claim 5, further comprising:
activating a fifth transistor to couple the second transistor to the third node, wherein precharging the third node is based at least in part on activating the fifth transistor; and
activating a sixth transistor, subsequent to activating the fifth transistor, to couple the third node to the first gate of the first transistor, wherein biasing the first gate of the first transistor is based at least in part on activating the sixth transistor.

9. The method of claim 1, wherein the first transistor and the second transistor each comprise a source follower circuit.

* * * * *